(12) United States Patent
Meyer

(10) Patent No.: US 8,368,286 B2
(45) Date of Patent: Feb. 5, 2013

(54) RESONANT POWER CONVERTER COMPRISING A MATCHED PIEZOELECTRIC TRANSFORMER

(75) Inventor: Kasper Sinding Meyer, Lyngby (DK)

(73) Assignee: Noliac A/S, Kvistgaard (DK)

( * ) Notice: Subject to any disclaimer, the term of this patent is extended or adjusted under 35 U.S.C. 154(b) by 344 days.

(21) Appl. No.: 12/735,766

(22) PCT Filed: Feb. 13, 2009

(86) PCT No.: PCT/EP2009/051712
§ 371 (c)(1),
(2), (4) Date: Aug. 27, 2010

(87) PCT Pub. No.: WO2009/101176
PCT Pub. Date: Aug. 20, 2009

(65) Prior Publication Data
US 2010/0328969 A1    Dec. 30, 2010

Related U.S. Application Data

(60) Provisional application No. 61/064,092, filed on Feb. 15, 2008.

(30) Foreign Application Priority Data

Feb. 15, 2008 (DK) .................................. 2008 00215

(51) Int. Cl.
*H01L 41/09* (2006.01)
(52) U.S. Cl. ....................................................... 310/318
(58) Field of Classification Search ................... 310/318
See application file for complete search history.

(56) References Cited

U.S. PATENT DOCUMENTS

| 5,923,542 | A  | * | 7/1999  | Sasaki et al. .................... 363/16 |
| 7,183,692 | B2 |   | 2/2007  | Chou et al. |
| 2001/0005107 | A1 |   | 6/2001 | Totsuka et al. |
| 2002/0085395 | A1 | * | 7/2002 | Navas Sabater et al. ....... 363/25 |
| 2005/0281061 | A1 | * | 12/2005 | Radecker et al. .......... 363/21.02 |
| 2008/0260402 | A1 | * | 10/2008 | Yasukawa ........................ 399/66 |
| 2010/0296316 | A1 | * | 11/2010 | Bothe et al. ..................... 363/19 |

FOREIGN PATENT DOCUMENTS

WO    WO 01/29957    4/2001

OTHER PUBLICATIONS

Francois Pigache et al., "Optimal Design of Piezoelectric Transformers: A Rational Approach Based on an Analytical Model and a Deterministic Global Optimization" IEEE Transactions on Ultrasonics, Ferroelectrics, and Frequency Control, vol. 54, No. 7, Jul. 2007, Piscataway, NJ, pp. 1293-1302.

Yoshiaki Shikaze et al., "A High Voltage Power Supply Operating under a Magnetic Field" Nuclear Science Symposium Conference Record, vol. 2., 2000 IEEE Lyon, France, Oct. 15-20, 2000, Piscataway, NJ, pp. 9_254-9_258.

(Continued)

*Primary Examiner* — Thomas Dougherty
(74) *Attorney, Agent, or Firm* — Harness, Dickey, & Pierce, P.L.C.

(57) ABSTRACT

The present invention relates to an electronic power converter comprising a piezoelectric transformer, a drive circuit arranged to generate and provide an input voltage signal to the piezoelectric transformer, said input voltage signal comprising a burst frequency and a substantially constant excitation frequency, and a rectifier module. According to the present invention the excitation frequency is selected among a plurality of excitation frequencies in such a way that an equivalent load resistance, $R_{eq}$, is matched to an output impedance of the piezoelectric transformer so as to minimize power losses in the piezoelectric transformer. Moreover, the present invention relates to a method for configuring an electronic power converter.

24 Claims, 23 Drawing Sheets

OTHER PUBLICATIONS

Figure 1:
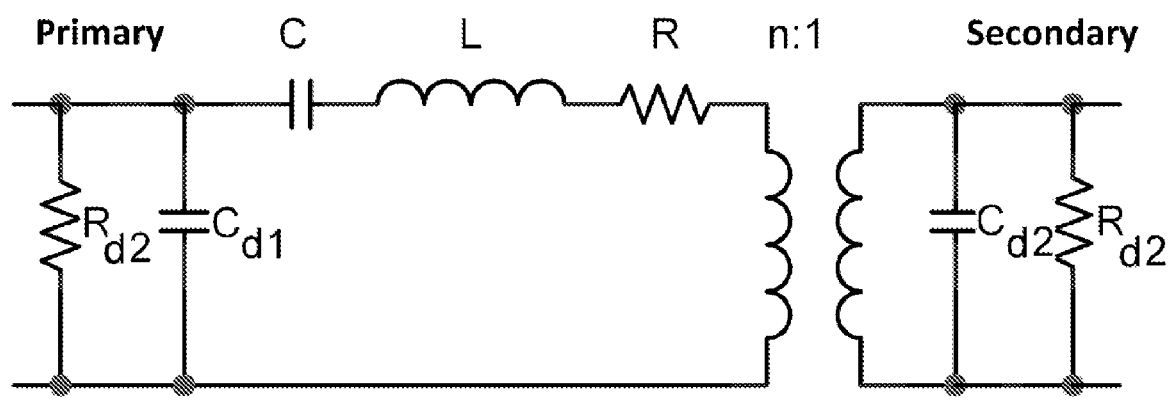

S.T. Yun et al., "Adaptive Phase Control Method for Load Variation of Resonant Converter with Piezoelectric Transformer" 7th International Conference on Power Electronics and Drive Systems, Nov. 27, 2007, Piscataway, NJ, pp. 164-168.

Juan A. Martin-Ramos et al., "A New Full-Protected Control Mode to Drive Piezoelectric Transformers in DC-DC Converters" IEEE Transaction on Power Electronics, vol. 17, No. 6, Nov. 2002, pp. 1096-1103.

Shih-Yu Chen et al., "ZVS Considerations for a Phase-Lock Control DC/DC Converter with Piezoelectric Transformer" IEEE Industrial Electronics, Nov. 6-10, 2006, Paris, France, pp. 2244-2248.

International Search Report.

* cited by examiner

Common Geometries

Transoner by Face       Rosen-type        NEC        Ring by Noliac

RESONANT POWER CONVERTER COMPRISING A MATCHED PIEZOELECTRIC TRANSFORMER

CROSS-REFERENCE TO RELATED APPLICATIONS

This is a National Stage application of International Application number PCT/EP2009/051712 and claims priority under 35 U.S.C. §119 to U.S. Provisional Application number 61/064,092 filed on Feb. 15, 2008, and Danish Application number PA 2008 00215 filed on Feb. 15, 2008, the entire contents of each of which is incorporated herein by reference.

The present invention relates to a closed-loop control technique and an associated arrangement for magnetic-less resonant converter power stages, said converter power stages comprising a piezoelectric transformer terminated with a variable load. High efficiency and high power density are obtained with low switching losses, a piezoelectric transformer adapted for zero voltage switching and emulation of a constant matched load towards the piezoelectric transformer.

In particular, the present invention relies on the characteristic effect of a piezoelectric transformer having a load dependent efficiency where the distinct maximum efficiency can only be obtained with one specific load. The resonant converter is operated in such a way that a variable load is emulated as a matched load towards the piezoelectric transformer in which the efficiency is maintained at its maximum point.

In a resonant converter the piezoelectric transformer is operated at and around its primary resonance mode. Within that limited frequency band the piezoelectric transformer can be represented electrically in the form of the equivalent resonant circuit in FIG. 1 and the equivalent parameters can be obtained from measurements on the physical device using the partial differential equation method, the finite element modeling method or 1 dimensional transmission line equivalent models etc. If this fitting process is done correct, the equivalent circuit in FIG. 1 will be a valid representation of the piezoelectric transformer and the properties derived from this circuit will be consistence with the properties of the real device in the proximity of the resonance frequency.

Open-loop Gain

A common characteristic for a resonant converter is that the open-loop gain is a function of the excitation frequency, the mechanical damping, the dielectric loss and the electrical load. Based on the equivalent circuit for the piezoelectric transformer in FIG. 1 the mechanical damping is represented by the loss resistance R and the dielectric loss is modeled with $R_{d1}$, $R_{d2}$.

Under normal operation, the load resistance, $R_L$, is dominant and accounts for the majority of the damping. The characteristic graph for the open-loop frequency dependent gain of a piezoelectric transformer is illustrated in FIG. 2, where the transfer function is shown in relation to a logarithmic range of loads.

Figure 2:
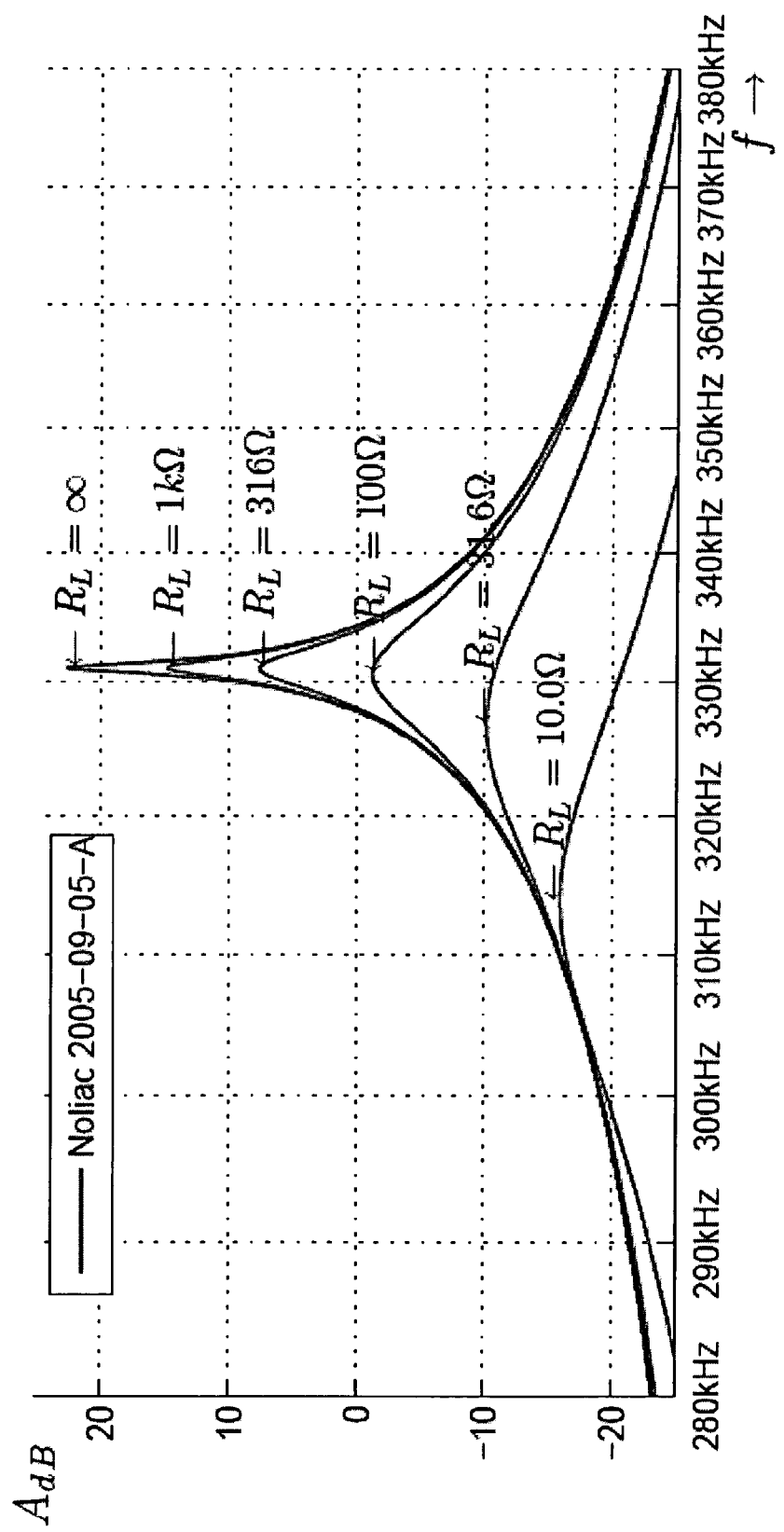

The maximum load of 10Ω in FIG. 2 represents the largest load that one would connect to the piezoelectric transformer of the specific type Noliac 2005-09-05-A. Consequently the gain at resonance varies from −16 dB ($R_L$=10Ω) to 22 dB ($R_L$=∞) or with a factor of 84 from a full load condition to a no load condition. Besides the distinct load dependence, the gain is also very sensitive to the excitation frequency. A small change in the excitation frequency of 2% can have an influence of as much as a factor of 10 on the gain at light loads.

Open-loop Gain and Open-loop Efficiency

As for the gain, the open-loop efficiency of a piezoelectric transformer is a function of the excitation frequency, the mechanical damping, the dielectric loss and the electrical load. The dielectric loss and the mechanical damping are considered device specific parameters and only the excitation frequency together with the electrical load can be altered for a given transformer.

Figure 3:
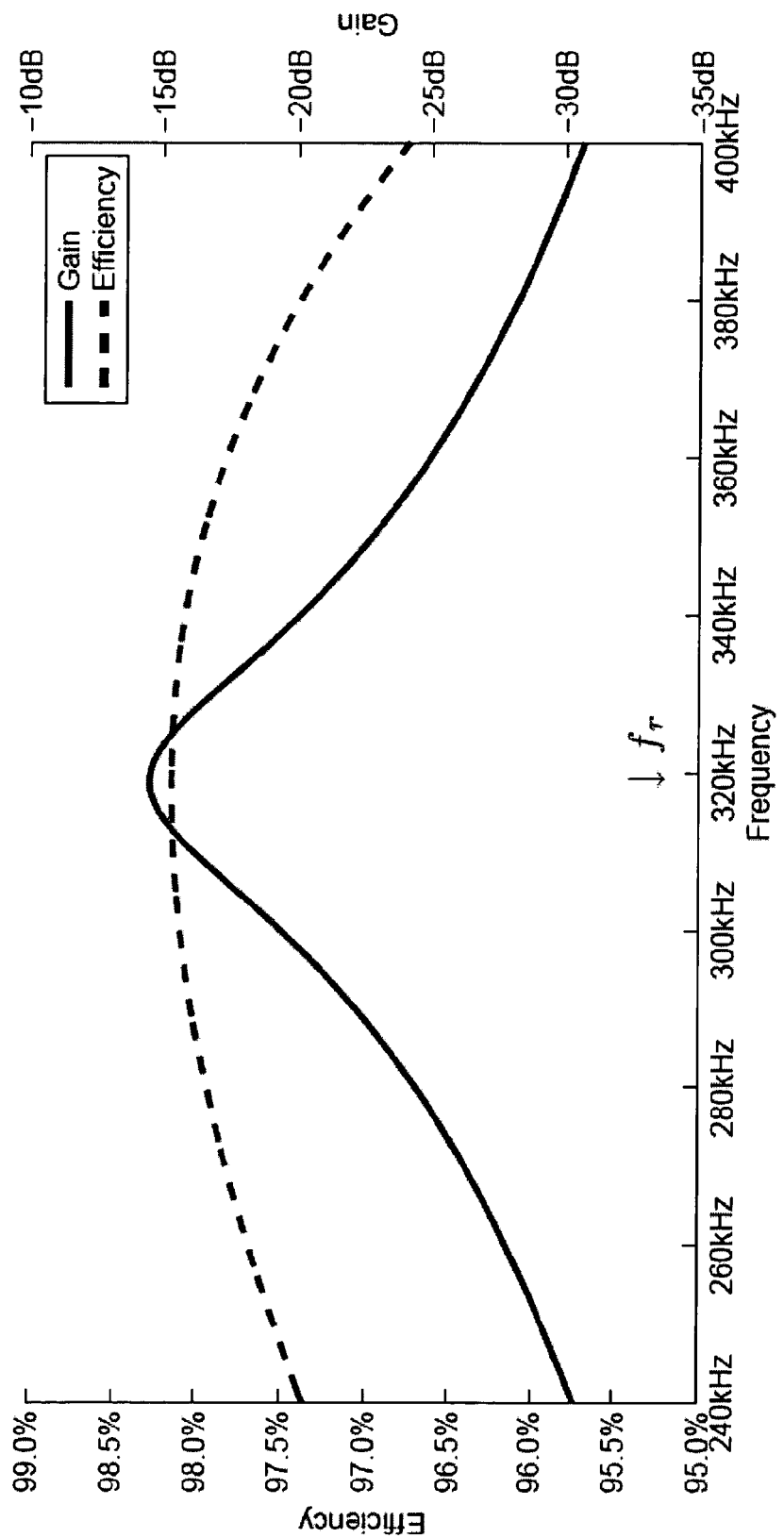

FIG. 3 illustrates the characteristic open-loop gain and open-loop efficiency in relation to the excitation frequency, given a constant (matched) electrical load. The gain varies over the whole frequency range and peaks at the physical resonance frequency of the piezoelectric transformer. Given the fact that the power delivered to the load peaks at the resonance frequency, the dielectric loss is most insignificant at this point, in which the efficiency of the device (under open-loop operation) also peaks at the resonance frequency. In most cases the derivative of the efficiency in relation to frequency, is so low that it can be considered constant at- and in the proximity of the resonance frequency. Given a constant electrical load, the gain is the only significantly variable quantity in relation to frequency.

The influence from the dielectric loss can be considered constant in the proximity of the resonance frequency and can therefore be included in the loss resistance R from FIG. 1. With $R_{d1}$, $R_{d2}$ from FIG. 1 merged into R, the efficiency, defined as the relation between the input and the output power, is given by:

$$\eta = \frac{P_{out}}{P_{in}} \Rightarrow \eta = \frac{n^2 R_L}{R(C_{d2}^2 R_L^2 \omega^2 + 1) + n^2 R_L} \tag{1.1}$$

Under normal operation the relative change in frequency in relation to the resonance frequency is insignificant. The absolute frequency, ω, can therefore be approximated by the resonance frequency $\omega_r$, in that the approximation has been made with respect to efficiency.

The open-loop efficiency curve for a piezoelectric transformer with a variable load and a constant excitation frequency is very dependent on the absolute value of the electrical load. This is illustrated for three different piezoelectric transformers in FIG. 4. The resonance frequencies, $f_r$, of the three piezoelectric transformers are 120 kHz, 123 kHz and 319 kHz.

Figure 4:
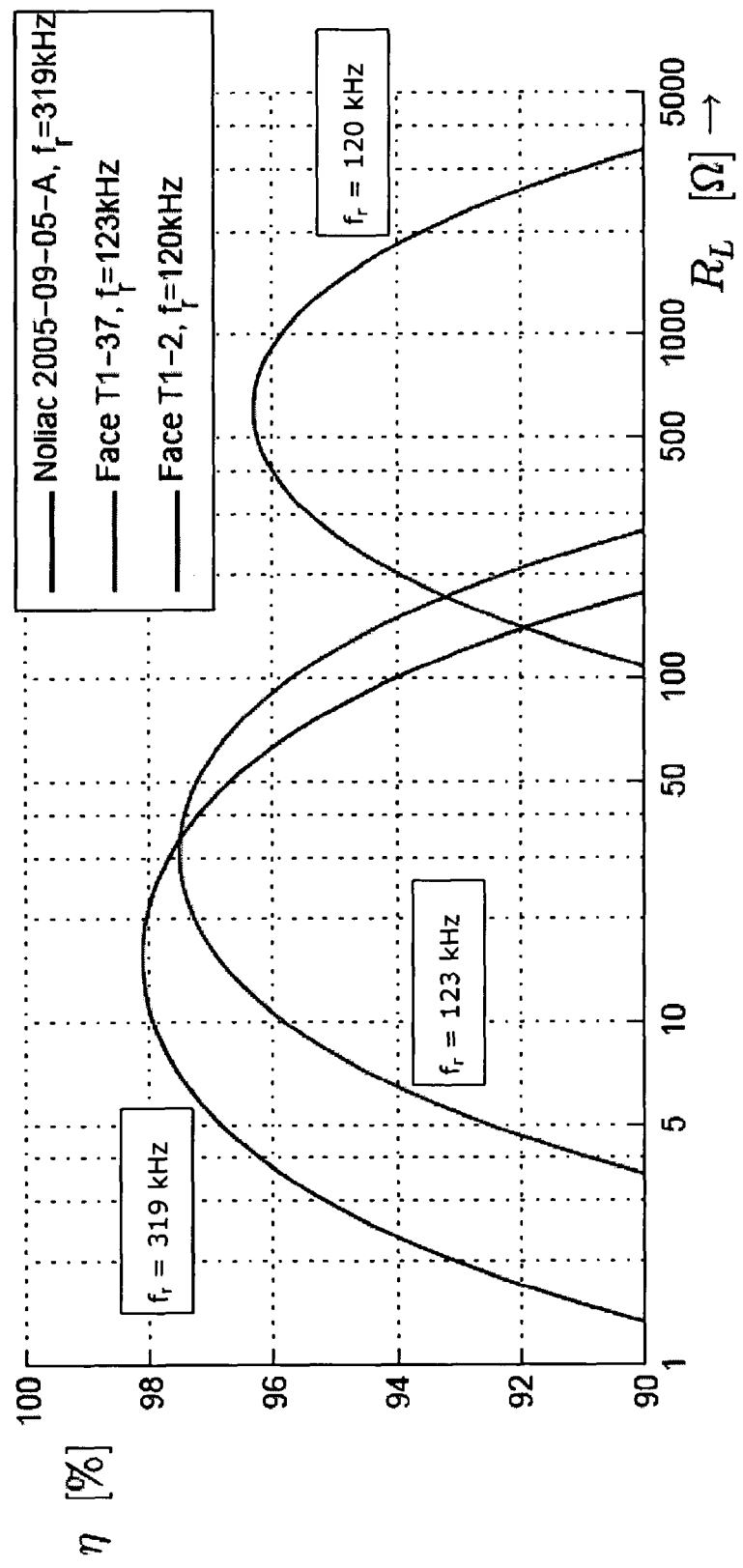

The plot of the efficiency for each transformer in FIG. 4, is characterized by a parabolic curve with one distinct maximum point given a logarithmic scale on the x-axis. Only if the load is equal to the maximum point or in the proximity of the maximum point, the transformer can be operated efficiently. The transformer "Noliac-2005-09-05-A" with $f_r$=319 kHz from FIG. 4 etc. has a peak efficiency of 98% at an electric load of 13Ω. Compared to this, the loss will be increased by 50% given a mismatched load at 6Ω or 40Ω that corresponds to an efficiency of 97%. It is an object of embodiments of the present invention to describe a closed-loop control technique that emulates a constant load towards a piezoelectric transformer although the load is in fact variable. For the "Noliac-2005-09-05-A" transformer a 13Ω load could be emulated although the load attached to the power converter is in fact varying from 8Ω to 5 kΩ etc. In this way the efficiency of the transformer can be kept at its maximum at all operating points.

The pronounced relation between the load and the efficiency can have an impact on the power density of a piezoelectric transformer and the power converter it is designed for, as the piezoelectric material has to be operated within certain temperature limits according to the parameters for the specific material. The temperature rise of a transformer is dependent on the power loss of the thermal impedance to the surroundings. An inefficient transformer or a transformer operated with an unmatched load can only dissipate a certain amount of heat within its footprint and this among others limits the maximum power throughput of the device.

The load related to the maximum efficiency point can be derived from (1.1) and is given by equation (1.2). This equation is very important as it shows that the optimal electrical load is a resistive load which is matched to the absolute value of the impedance of the output capacitance $C_{d2}$. Again the excitation frequency $\omega$ can be approximated by the resonance frequency $\omega_r$.

$$o = \frac{d\eta}{dR_L} \Rightarrow R'_L = \frac{1}{C_{d2}\omega} \qquad (1.2)$$

Operation with a matched load is a key factor for high efficiency, but following from the state-of-the-art this is not consistent with a variable output power and a variable load.

Most power converters are in fact designed specifically for a variable load and an object of embodiments of the present invention is to join the conflicting objectives of high efficiency combined with a variable load, by emulating a matched load towards the piezoelectric transformer although the load attached to the power converter can take any value within the range of zero to full output power.

Power Stage Configurations and Corresponding Efficiency

With the objective of optimizing the efficiency and power density of a power converter, the focus is not solely on the piezoelectric transformer alone but also on the configuration of the surrounding electronics. An efficient transformer is not equal to an efficient power converter if the power stage is reliant on one or more assisting magnetic components or if the control technique enforces non-optimal operating conditions on the piezoelectric transformer or the power stage. The present invention is based upon the design trade-offs for state-of-the-art power stages and a general description of the problems that can be encountered will be made.

Figure 5:
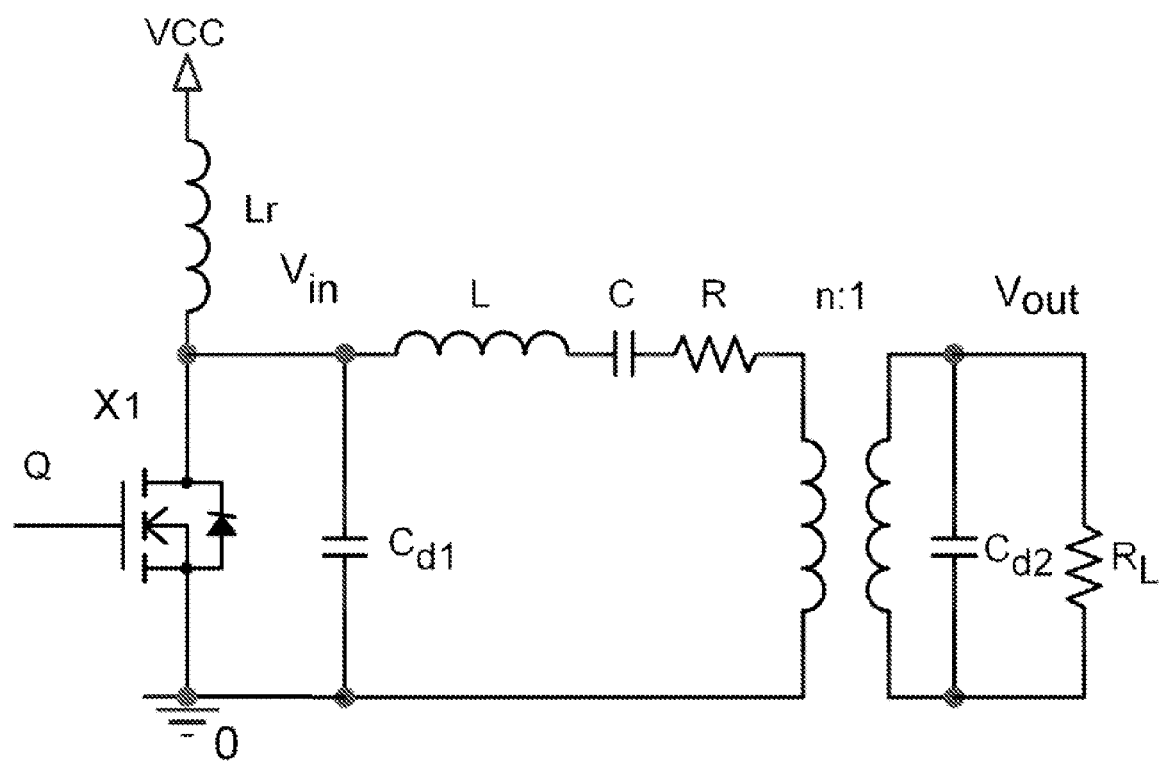

FIG. 5 illustrates the power stage for a Class-E converter connected to the first order equivalent diagram of a piezoelectric transformer with an arbitrary load $R_L$. The topology consists of one switching element sourced from an inductor connected to the DC-supply, Vcc. This configuration is favorable for its simplicity and is commonly used in step-up CCFL ballast converters. In steady state mode, (at a state in time longer than the time constants of the system), the reactive energy stored in the inductor, enables the power switch to be operated in soft-switching mode, which minimizes the switching loss. Given that the volt-second balance across the inductor has to be satisfied, the peak voltage across the switching element is in the order of 4 times the supply voltage, Vcc. The high stress imposed on the switching element has a negative impact on the conduction loss. For all types of switching elements and in particular MOSFET, which are most suited for switching above 100 kHz, a trade-off is made between the breakdown-voltage of the device and the ON resistance. For a given die-area, the ON resistance is increased by the square of the breakdown-voltage.

The high voltage stress on the switching element in a Class E is the main drawback of this power stage. In applications where the supple voltage is a rectified 230V AC voltage, the peak stress across the switching element is above 1.2 kV, which is well beyond the breakdown-voltage of most commercially available MOSFETs. Additionally the high stress also applies to the current source inductor, which limits the efficiency and power density of the topology as well as increases the component costs. The Class-E power stage is most commonly used to step-up from a low supply voltage in a CCFL driver, where the simplicity of the gate-drive circuit is favorable and where the efficiency is not a large concern.

U.S. Pat. No. 5,923,542 and US 2001/0005107 A1 are examples of Class-E power stage derivatives used to drive a piezoelectric transformer.

Figure 6:
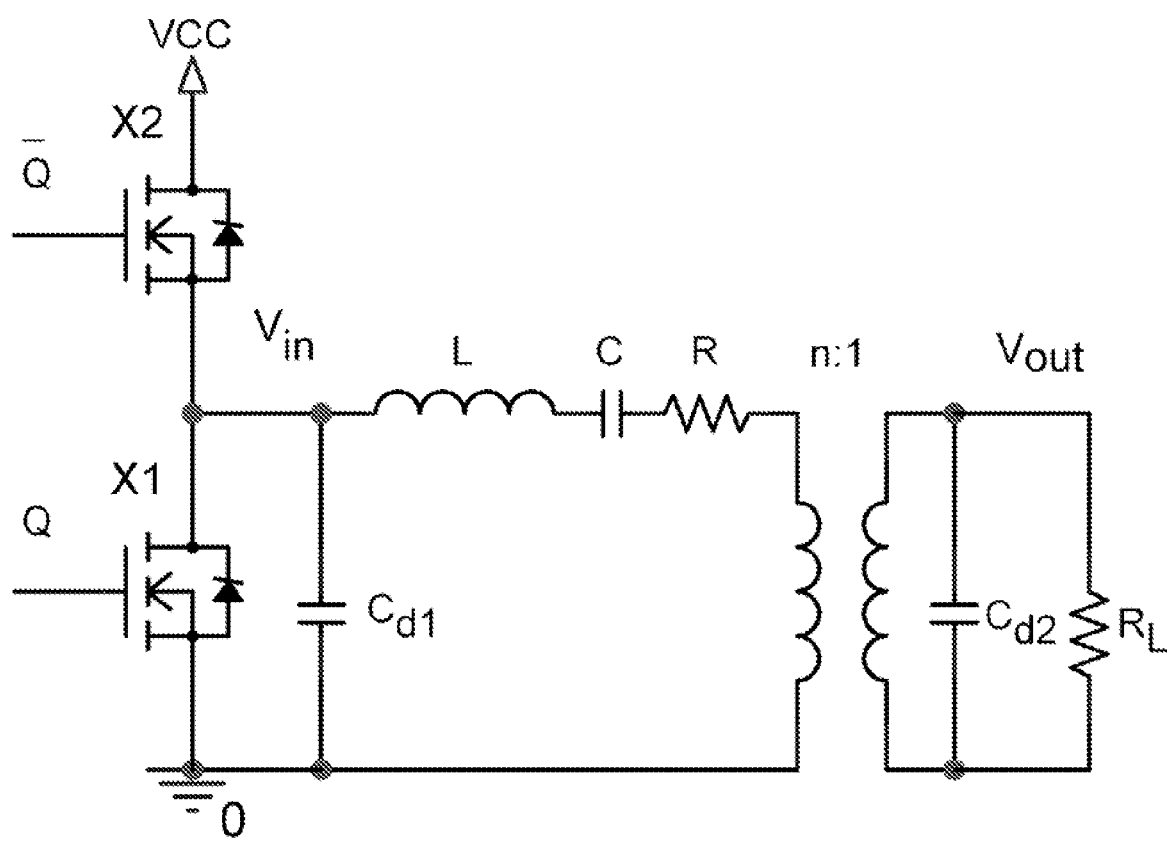

The half-bridge power stage in FIG. 6 does not suffer from a high voltage stress on the switching elements as it is the case for the Class-E power stage, in fact the peak voltage is equal to the supply voltage, Vcc. Depending on the control circuit and the specific piezoelectric transformer, the half-bridge power stage can be power efficient, given the lower component stress compared to the Class E converter.

A common characteristic for piezoelectric transformers is that the input capacitance is about two orders of a magnitude larger than the parasitic capacitance of the switching elements optimized for that application. If the large size of the transformer input capacitance is not accounted for, the switching losses will be comparable to the output power of the transformer, i.e. efficiency of 50% or less. This will be the case if the switches are operated with a dead-time approaching zero or if the transformer is not designed for soft-switching.

Figure 7:
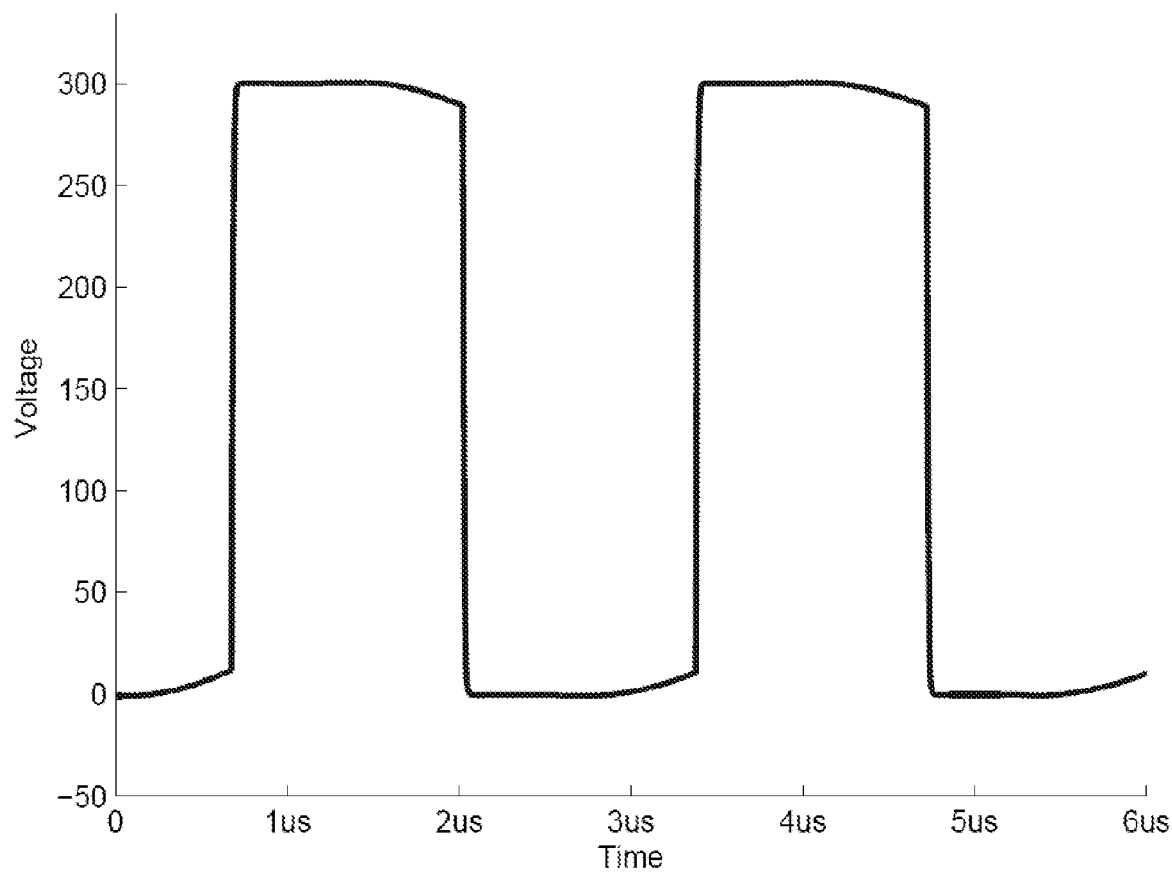

FIG. 7 illustrates the input wave-form to a piezoelectric transformer when operated in hard-switching mode. The charging and discharging of the input capacitance of the transformer through the switches, induce a current in the switches concurrent with a voltage drop across them, which gives rise to joule heating. This power loss can be quantified as a function of the supply voltage, the switching frequency and the input capacitance of the piezoelectric transformer as stated by (4.4). The influence from the output capacitance of the switches can typically be neglected.

$$P_{MOSFETs} = 2Qf = fC_{d1}V_{CC}^2 \qquad (4.4)$$

In hard-switching mode the power loss in the switches is dominated by switching losses and can be considered almost constant. The power delivered to the piezoelectric transformer is dependent on small variations in the excitation frequency and the electrical load.

Figure 8:
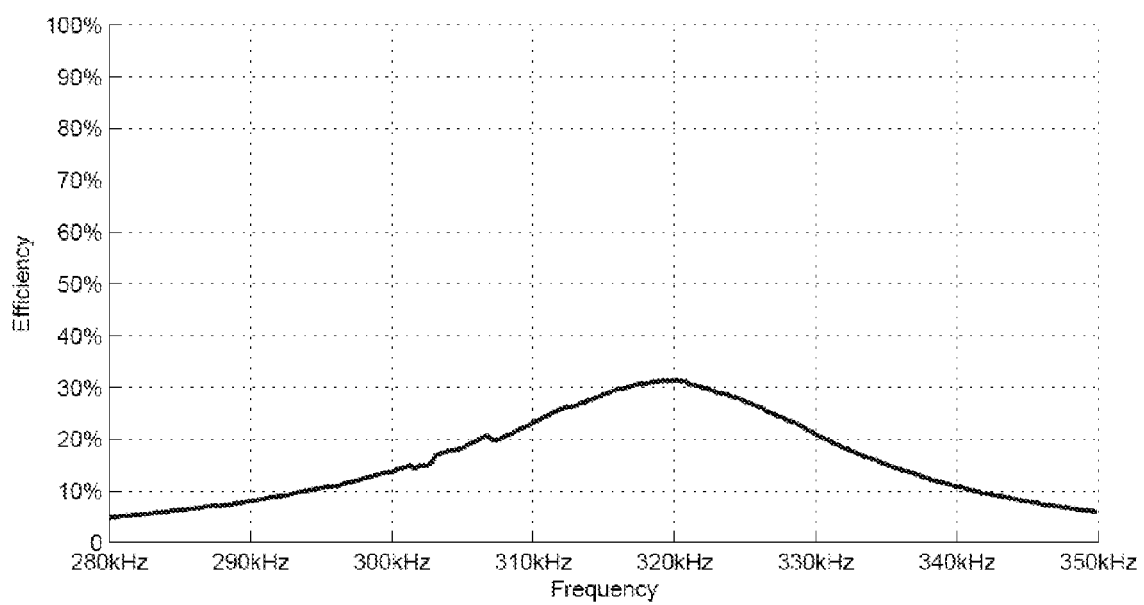

FIG. 8 displays the efficiency of a power stage operated in hard-switching mode connected to a piezoelectric transformer (Noliac 2005-09-05-A in this case) with a matched electrical load. The efficiency peaks at the physical resonance frequency, where the most power is transferred to the load, but the numerical value is still a low 32% because of the high hard-switching losses. In the close proximity of the resonance frequency, the power stage efficiency drops below 10%.

Any power stage topology, where one or more of the nodes of the switch or the switching elements, is connected directly to a piezoelectric transformer, should never be operated in hard switching mode, unless the efficiency is not a concern. Adding one or more series or parallel inductors to a power stage can resolve the problem with hard-switching losses and is commonly used in the state of the art. This approach can however have its side effects. Adding inductors to a power stage can introduce new problems such as increased conduction losses in the power switches and introduce new sources of power loss due to the increased number of passive components.

The Class E converter in FIG. 5 which is commonly used in low-voltage step up converters is an example of a power stage where one power switch is connected directly to a piezoelectric transformer. In this topology the circulating energy stored in the current source inductor can be used to attain zero voltage switching in steady state mode and thereby reduce the switching losses to almost zero.

Figure 9:
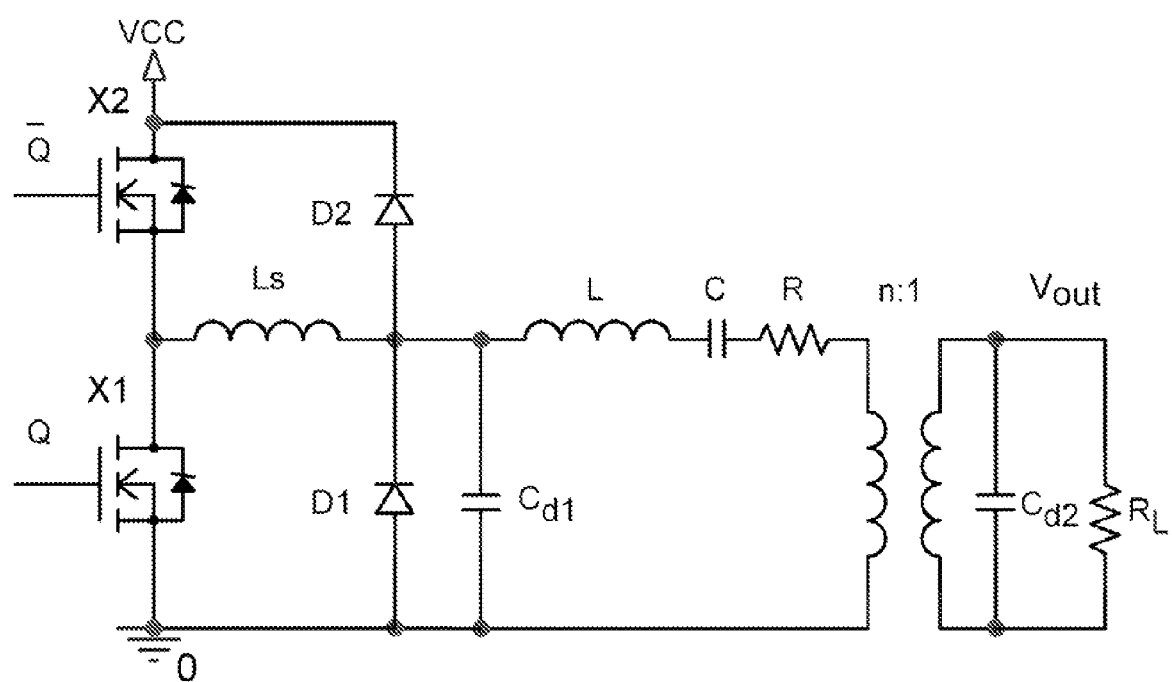

Hard switching losses can also be avoided in the half-bridge power stage in FIG. 6 by placing an inductor in parallel with the input terminal of the piezoelectric transformer. This enables the switches to be operated in zero-voltage-switching mode by means of energy stored in the inductor. Alternatively the half-bridge power stage can also be configured with a series inductor between the power switches and the input to the piezoelectric transformer as illustrated in FIG. 9 as employed in U.S. Pat. No. 7,183,692 and US 2002/0085395 A1. Because of the inductive path between the switches and the transformer, the high input electrode capacitance $C_{d1}$ does not induce a large power loss in the power switches. As for the parallel inductor configuration, zero voltage switching can be attained under the right operation conditions. Typically this means having an inductor with an absolute impedance that is matched to the transformer input capacitance. Smaller or larger inductor values can be used, but will typically enforce increased conduction losses due to circulating currents or limit the soft-switching abilities of the power stage.

Figure 10:
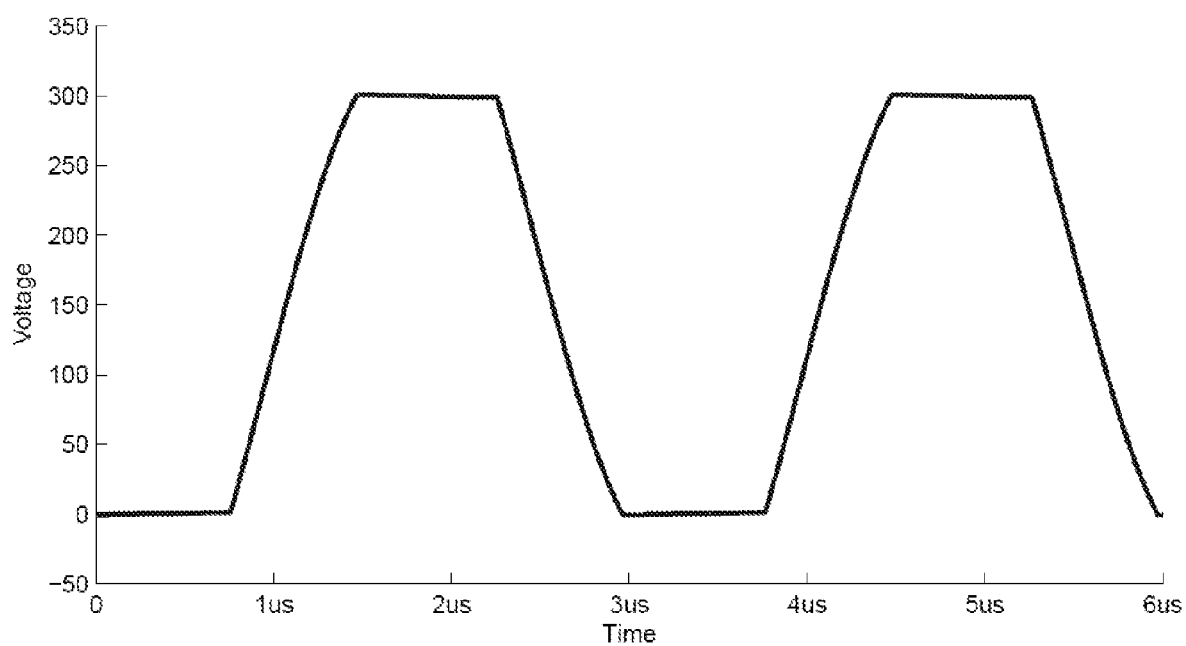

FIG. 10 displays the voltage at the output note of the power switches in FIG. 9, when operated with a specific dead-time period, a matched electric load and a specific frequency of zero-voltage-switching mode.

The series inductor configuration increases the order of the circuit state space model by two, which behaves as an additional resonance frequency of the power converter. This can give rise to peak voltages across input terminal of the transformer which can exceed well beyond the supply voltage for the power stage. The two diodes in FIG. 10 provide a means for clamping the transformer input voltage and avoid sparks the can destroy the dielectric material. Although necessary, the clamping diodes do add to the complexity, cost and power loss of the power converter.

Figure 11:
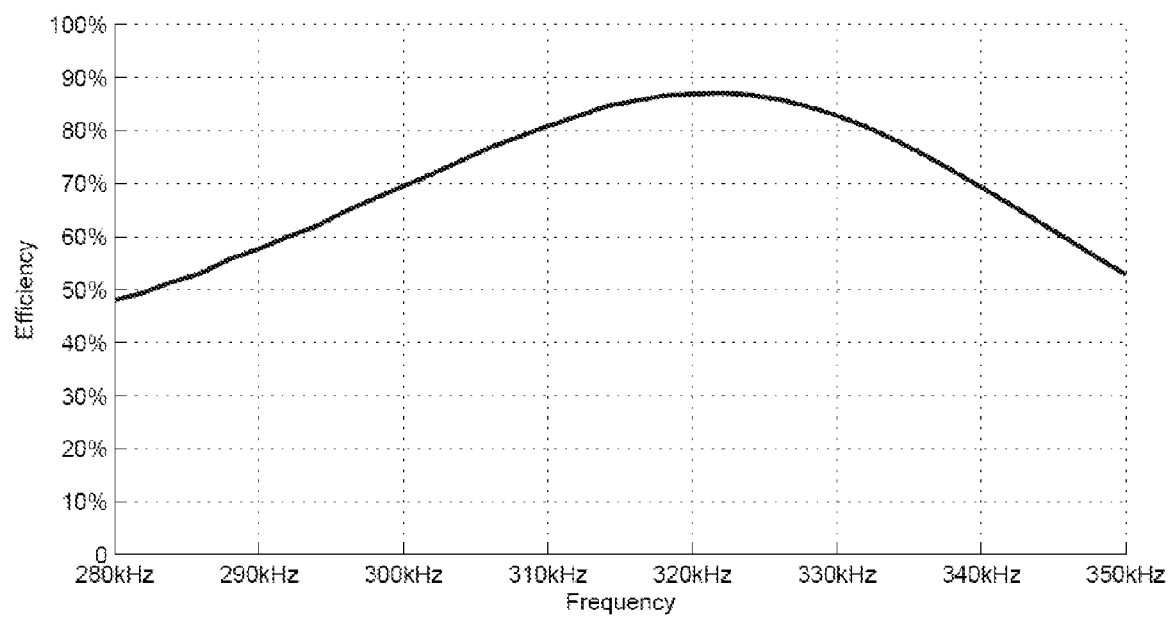

With a series or parallel inductor connected to the half-bridge power stage, the zero voltage switching bandwidth is typically larger than the frequency range in which the piezoelectric transformer normally is operated. FIG. 11 displays the efficiency for the series inductor configuration from FIG. 9, where the piezoelectric transformer is terminated with a matched load. Compared to the hard-switched power stage, the efficiency (excluding the piezoelectric transformer and the inductor) has improved from about 32% max for the configuration in FIG. 6 to about 88% for the configuration in FIG. 9. In relation to a typical efficiency of 98% for a thickness-mode piezoelectric transformer, the loss in the power stage is about 6 times higher, which can be considered a significant difference. This gab can be attributed to the increased circulating energy from the inductor which induces conduction losses in the power switches. Some optimization can be achieved with respect to circulating energy and the size of the series inductor, but several trade-offs has to be made. Additionally the added inductor introduces an extra source of power loss and can not be chosen arbitrary. Special attention has to be made with respect to the skin-effect, the proximity effect and core losses. In the example from FIG. 11 the efficiency for the power stage including the series inductor is well below the 88% shown in the plot. Generally an excitation circuit utilizing a series or parallel inductor will be bulky, inefficient and dissipate significantly more power than the piezoelectric transformer. Overall the power density will be low for power converters utilizing one or more inductors to improve soft-switching properties, and the added cost of the inductor is also a factor the take into consideration. Radiated EMI from the inductor can also become a problem that can otherwise avoided with piezoelectric transformers, which can be subscribed to their inherent magnetic-less operation.

Figure 12:
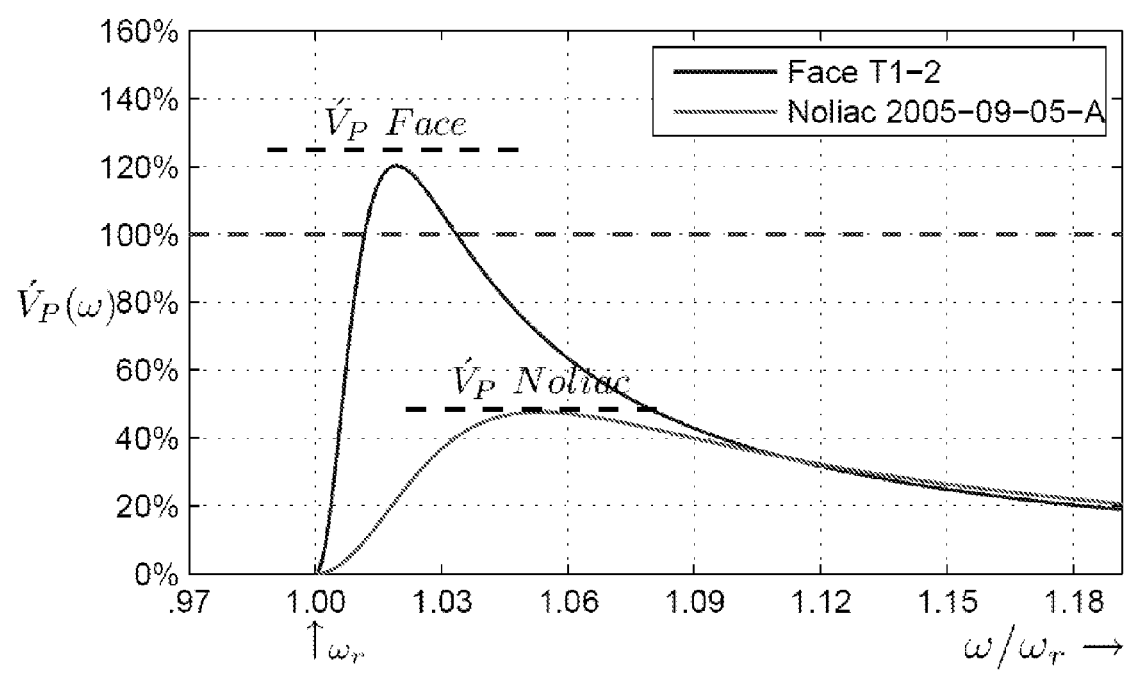

The half-bridge power stage in FIG. 6 can also be operated in zero-voltage-switching mode without the aid of inductors, but this can only be achieved under very special operating conditions—namely:

1. It requires the utilization of the reactive mechanical energy, oscillating back and forth in a piezoelectric transformer excited by a power stage, as a means to charge and discharge the dielectric input capacitance of the device. This is only possible if the load is unmatched i.e. less damping or if the efficiency if the transformer is sacrificed for a design with more reactive energy.
2. FIG. 12 displays the zero voltage switching ability for two different piezoelectric transformers in relation to a relative frequency axis. If Zero voltage switching can be achieved (Vp>100%) the ability will be limited to a small frequency band. This complicates the controllability of the output voltage in a piezoelectric power converter which explains why an inductor less power stage as the half-bridge stage in FIG. 6, has only been seen in inverters for fluorescent lamps etc. where the load and excitation frequency is constant and where the output voltage is unregulated.

In order to operate a piezoelectric transformer at its maximum efficiency the following design issues have been dealt with by the inventors: Emulation of a constant load towards the piezoelectric transformer, provide regulation of the output voltage of any given piezoelectric power converter, achieve zero-voltage switching of the power stage utilizing reactive energy from the transformer (i.e. inductor-less), operate the power stage at an essentially constant excitation frequency at the point at which zero-voltage-switching ability of the transformer peaks, prescribe the electrode dimensioning of the piezoelectric transformer for unconditionally zero-voltage-switching ability with respect to the load. All of these properties should preferably be complied with concurrently within the full range of loads a given piezoelectric power converter is specified for.

In this way the transformer can be operated at its maximum efficiency at the whole range of loads a given piezoelectric power converter is specified for and the power stage will also operate with a minimum switching loss due the unconditionally zero-voltage-switching ability of the transformer. Because the zero-voltage-switching ability for a piezoelectric transformer will always be very limited even for an optimized design, the conduction losses in the power stage due to circulation currents will also be kept at a minimum.

Closed-loop Control

The purpose of a closed-loop control circuit is to ensure a constant output voltage under different operating conditions such as different output power levels and input voltages. Additionally, the gain of a piezoelectric transformer is very dependent on the load and the excitation frequency as shown in FIG. 2 which has to be taken into account as well. There are several closed-loop control techniques to control the gain of a piezoelectric transformer when the load varies. There are over-all three fundamentally different types of modulation commonly known as frequency modulation (FM), pulse width modulation (PWM) and burst mode modulation (BMM). Other modulation techniques are usually derived from these three types, e.g. a combination of FM+PWM has been reported. The power stage may also be operated without modulation. For example, in lamp ballast applications the unregulated power stage has the advantage that the load dependent gain of the piezoelectric transformer can be exploited to ignite the lamp.

The most commonly applied modulation type for driving resonant converters is frequency modulation. The principle behind frequency modulation is to operate the piezoelectric transformer off resonance and control the frequency in accordance to the load. Based on the transfer function of a piezoelectric transformer as shown in FIG. 2 the gain of the transformer is dependent on frequency and the load resistance. In order to obtain a desired gain using a specific load resistance, there exist a maximum of two frequencies at which this gain can be obtained. One frequency lies above the damped resonance frequency (the gain maximum) and one frequency below the damped resonance frequency.

Figure 13:
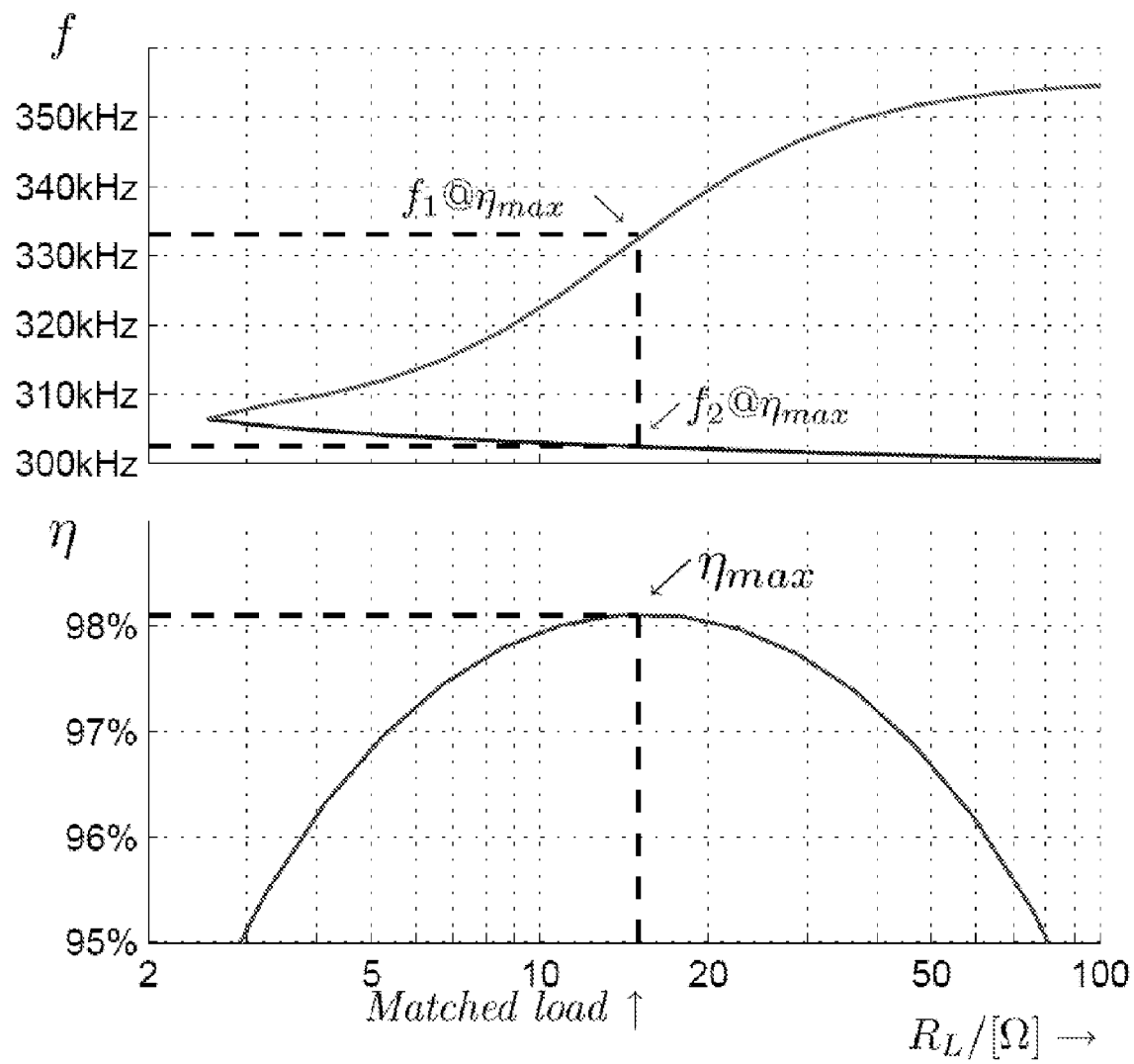

In the top plot in FIG. 13 the two frequency solutions is plotted as a function of the load resistance for the piezoelectric transformer 2005-09-05-A by Noliac A/S using a constant gain of −20 dB. If the load varies the efficiency varies as well and only when the load is matched to the transformer the efficiency is high. This is shown in the bottom plot in FIG. 13. Frequency modulation can not be efficiently implemented with an inductor-less power stage, as the Half-bridge shown in FIG. 6 since the range on controllability is non-existing due to the very limited zero-voltage switching bandwidth (as illustrated in FIG. 12). Magnetic support in the power stage using frequency modulation is required in order to avoid excessive switching losses.

The properties of PWM modulation for piezoelectric transformers are somewhat different from what is known from magnetic converters, although the power stages and control principles are the same. A way to analyze a piezoelectric transformer under PWM operation is to think of it as a bandpass filter. When a PWM waveform is applied at the input of a piezoelectric transformer, it will only be exited by the fundamental Fourier component of that signal. Given that the amplitude of the fundamental Fourier component is dependent on the duty-cycle of the PWM waveform, the load dependent gain of a piezoelectric transformer can be compensated. As for frequency modulation the efficiency is only high at the operating point at which the load is matched. Additionally, zero voltage switching of the power stage with the aid of inductors can only be achieved at a limited range of duty-cycles, which limits the desired controllability range. PWM modulation can not be efficiently implemented with an inductor-less power stage as the Half-bridge shown in FIG. 6 since the range on controllability is non-existing due to the very limited zero-voltage switching bandwidth (as illustrated in FIG. 12).

Examples of prior systems may for example be found in WO 01/29957 and US 2002/0085395.

It may be seen as an object of embodiments of the present invention to provide a method for operating a resonant converter using a piezoelectric transformer.

It may be seen as a further object of embodiments of the present invention to provide a method where a matched load resistance is emulated towards a piezoelectric transformer although the load is in fact varying.

It may be seen as an even further object of embodiments of the present invention to provide a method where a power stage is operated in soft-switching mode utilizing reactive energy from the piezoelectric transformer and wherein the output voltage is controlled at a constant level while maintaining an unconditional state of zero voltage switching.

It may be seen as an even further object of embodiments of the present invention to describe a way of designing a piezoelectric transformer towards soft-switching with a matched load. In terms on load impedance soft-switching can unconditionally be guarantied.

It may be seen as an even further object of embodiments of the present invention to keep the component count in a piezoelectric converter at a minimum while operating these components at their maximum efficiency. Due to the limited amount of generated heat, this enables piezoelectric power converters with a very high power density and high efficiency as well as low cost.

The limited controllability associated with pulse width modulation and frequency modulation in combination with an inductor-less power stage is solved by exciting the piezoelectric transformer with a constant excitation frequency and operate the power stage in a low frequency alternating ON and OFF state where the duty-cycle controls the power delivered to the load. This modulation type is named burst mode modulation. The main advantage of burst mode modulation is that under certain operation conditions load matching can be emulated. In this way the piezoelectric transformer can be operated at its maximum efficiency although the load in fact varies. Because the excitation frequency is kept substantially constant it is also possible to operate controllable power switches in a soft-switching mode with an inductor-less power stage. Soft-switching may be achieved with an unmatched load, i.e. less damping but also lower efficiency.

The above-mentioned objects are complied with by providing, in a first aspect, an electronic power converter comprising a piezoelectric transformer comprising an input and an output port, a drive circuit arranged to generate and provide, from a supply voltage $V_{cc}$, an input voltage signal to the input port of the piezoelectric transformer, said input voltage signal comprising a burst frequency and a substantially constant excitation frequency, and a rectifier module comprising an input port operatively coupled to the output port of the piezoelectric transformer, the rectifier module further comprising an output port adapted to deliver an output voltage, $V_{out}$, to a load, wherein the excitation frequency is higher than a fundamental resonance frequency of the piezoelectric transformer, and wherein the excitation frequency is selected among a plurality of excitation frequencies in such a way that an emulated equivalent load resistance, $R_{eq}$, under closed-loop burst mode operation is matched to an output impedance of the piezoelectric transformer so as to minimize power losses in the piezoelectric transformer, and wherein the selected excitation frequency falls within an optimal excitation frequency range regarding zero-voltage-switching abilities of the piezoelectric transformer.

In order to match the load to the piezoelectric transformer at a given excitation frequency, and at that same frequency ensures that the zero-voltage-switching abilities of the transformer peaks require that the transformer and the chosen working points are matched to each other. In particular, the gain the transformer, i.e. the ratio between the input voltage and the output voltage, should be properly chosen in order to obtain coinciding or near coinciding matched load frequency and optimal zero-voltage-switching frequency.

Figure 18:
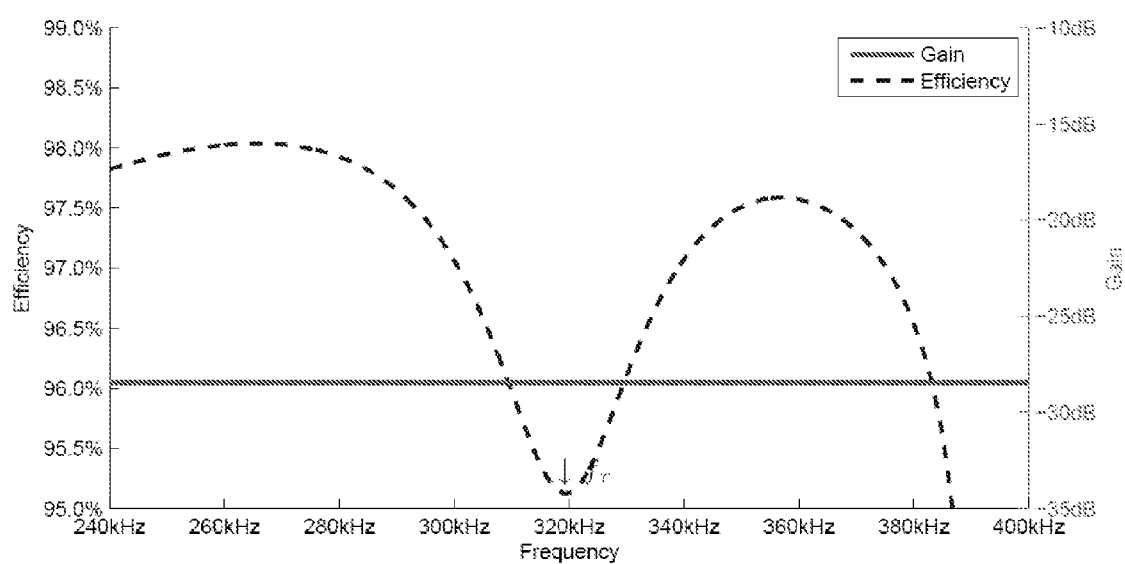
Figure 19:
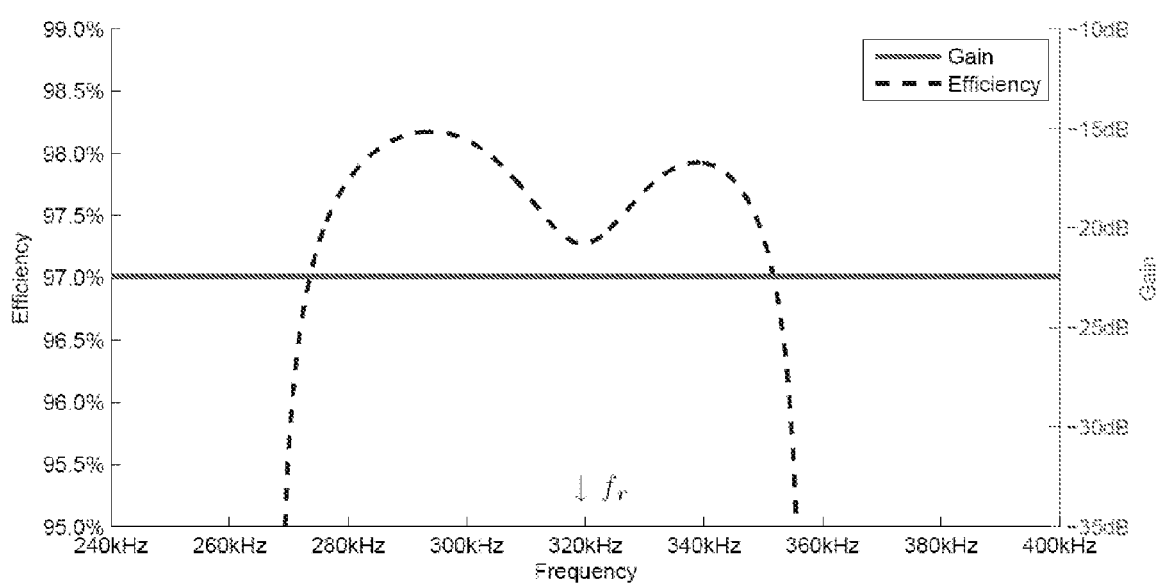
Figure 21:
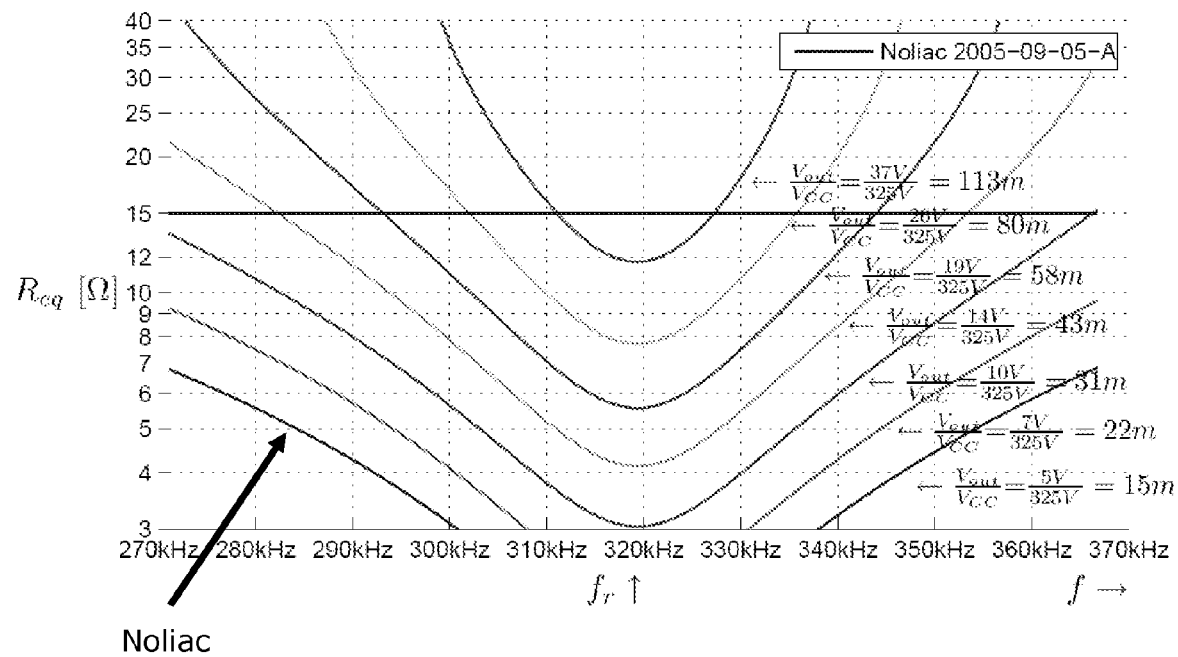

The excitation frequency is selected in accordance with the closed-loop equivalent load solution space depicted in FIG. 21 and the closed-loop efficiency plots shown in FIG. 18 and FIG. 19. The selection of excitation frequency will be described in further details below.

The output voltage, $V_{out}$, of the rectifier module may be a DC output voltage.

It should be noted that the excitation frequency may be changed within a narrow frequency range. This narrow frequency range may be a few percent of the absolute value of the excitation frequency. This minor change of excitation frequency allows the converter to compensate for external disturbances, such as for example temperature changes. Thus, if the optimal excitation frequency for a given $R_{eq}$ at start-up is 320 kHz temperature changes may cause that the optimal excitation frequency is shifted to 330 kHz for the same emulated equivalent resistance $R_{eq}$ or to maintain the soft-switching ability of the power stage.

The drive circuit may provide the input voltage signal directly to the input port of the piezoelectric transformer. Thus, the drive circuit may be connected directly to the input port of the piezoelectric transformer without any discrete components, such as an inductor, inserted between the drive circuit and the piezoelectric transformer.

The drive circuit may, among other configurations, comprise a half-bridge, or alternative a full bridge, power stage comprising an appropriate number of controllable switches. Thus, a half-bridge stage may comprise first and second controllable switches whereas a full-bridge power stage may comprise first, second, third and fourth controllable switches. Each of the controllable switches may be a field effect transistor. However, other types of switches may also be applicable. A control module may be applied for generating switching pulses to the controllable switches.

The rectifier modular may comprise a passive rectifier configuration with or without an inductor or an active rectifier configuration with or without an inductor. Thus, the rectifier module may, for example, comprise a full-bridge rectifier in the form of four diodes connected in a Wheatstone bridge. Alternatively, the rectifier module may include a voltage doubler with active rectification to obtain higher efficiency. Active rectification may be provided using field effect transistors. It should be noted that other rectifier arrangement are also applicable.

Preferably, the burst frequency is lower than the excitation frequency. In fact the burst frequency may be variable within a predetermined frequency range. For example, such predetermined range may involve frequencies within the range 0-700 Hz, such as within the range 300-450 Hz, such as approximately 400 Hz. In special circumstances the burst frequency may be 0 Hz at full or at no (zero) load.

The excitation frequency may be selected within the range 200-500 kHz, such as within the range 300-400 kHz, such as within the range 50-75 kHz so that the equivalent load resistance, $R_{eq}$, is matched to the output impedance of the piezoelectric transformer so as to minimize power losses in the piezoelectric transformer.

It should be noted that the burst frequency and the excitation frequency is by no means limited to the above-mentioned frequency ranges. Thus, the burst frequency may reach several hundreds kHz whereas the excitation frequency may be in the MHz range. In order to keep losses at a reasonable low level the burst frequency should be kept as low as possible. On the other hand the burst frequency should be kept at a high level in order to reduce the physical dimensions of the capacitors in the system. Audible noise is also an issue and for that reason the burst frequency should preferably be kept in the low range of the audio band or above the audio band.

The piezoelectric transformer is preferably adapted for unconditionally zero-voltage-switching with respect to any load impedance. This may be complied with by ensuring that an equivalent output capacitance, $C_{d2}$, of the piezoelectric transformer is at least 13%, such as at least 15%, such as at least 20%, such as at least 30%, such as at least 35%, larger than an equivalent input capacitance, $C_{d1}$, times a conversion ratio, n, square, i.e. $n^2$.

Moreover, the piezoelectric transformer may be adapted to transfer a main part of its energy in its thickness mode, and at the same time comply with the condition for unconditionally zero-voltage-switching with respect to any load impedance by making a volume of a secondary electrode at least 13%, such as at least 15%, such as at least 20%, such as at least 30%, such as at least 35%, larger than a volume of a primary electrode.

Alternatively, the piezoelectric transformer may be adapted to transfer a main part of its energy in its radial mode, and at the same time comply with the condition for unconditionally zero-voltage-switching with respect to any load impedance by making a volume of a primary electrode at least 13%, such as at least 15%, such as at least 20%, such as at least 30%, such as at least 35%, larger than a volume of a secondary electrode.

The specified volumes of the primary and secondary electrodes refer to the total volumes of the primary and second electrodes, respectively. Thus, the terms " . . . a volume of a primary electrode" refers to the total volume of those electrodes (for example a plurality of primary electrodes coupled in parallel) forming the primary electrode. Similarly, the terms " . . . a volume of a secondary electrode" refers to the total volume of those electrodes (for example a plurality of secondary electrodes coupled in parallel) forming the secondary electrode The piezoelectric transformer may be a ring-shaped piezoelectric transformer. However, other shapes may also be applicable. The output voltage, $V_{out}$, of the piezoelectric transformer may be within the range 5-40 V, and the equivalent load resistance, $R_{eq}$, may be within the range 3-40Ω. However, both the output voltage and the equivalent load resistance may be chosen differently.

In a second aspect, the present invention relates to a method for configuring an electronic power converter, the method comprising the steps of providing a piezoelectric transformer comprising an input and an output port, providing a drive circuit arranged to generate and provide, from a supply voltage $V_{cc}$, an input voltage signal to the input port of the piezoelectric transformer, said input voltage signal comprising a burst frequency and a substantially constant excitation frequency, and providing a rectifier module comprising an input port adapted to be operatively coupled to the output port of the piezoelectric transformer, the rectifier module further comprising an output port adapted to deliver a DC output voltage, $V_{out}$, to a load, and selecting the excitation frequency among a plurality of excitation frequencies in such a way that an emulated equivalent load resistance, $R_{eq}$, under closed-loop burst mode operation is matched to an output impedance of the piezoelectric transformer so as to minimize power losses in the piezoelectric transformer, and wherein the selected excitation frequency falls within an optimal excitation frequency range regarding zero-voltage-switching abilities of the piezoelectric transformer.

As previously mentioned, in order to match the load to the piezoelectric transformer at a given excitation frequency, and at that same frequency ensures that the zero-voltage-switching abilities of the transformer peaks require that the transformer and the chosen working points are matched to each other. In particular, the gain the transformer, i.e. the ratio between the input voltage and the output voltage, should be properly chosen in order to obtain coinciding or near coinciding matched load frequency and optimal zero-voltage-switching frequency.

The excitation frequency is selected in accordance with the closed-loop equivalent load solution space depicted in FIG. 21 and the closed-loop efficiency plots shown in FIG. 18 and FIG. 19.

Again, the excitation frequency is higher than a fundamental resonance frequency of the piezoelectric transducer.

The drive circuit may provide the input voltage signal directly to the input port of the piezoelectric transformer. Thus, the drive circuit may be connected directly to the input port of the piezoelectric transformer without any discrete components, such as an inductor, inserted between the drive circuit and the piezoelectric transformer.

The drive circuit may, among other configurations, comprise a half-bridge power stage comprising first and second controllable switches. Alternatively, the drive circuit may comprise a full-bridge power stage comprising first, second, third and fourth controllable switches. Each of the controllable switches may be a field effect transistor or a similar controllable switch. A control circuit may be applied for generating switching pulses to the controllable switches.

As previously mentioned, the rectifier module may comprise a passive rectifier configuration with or without an inductor or an active rectifier configuration with or without an inductor. Thus, the rectifier module may, for example, comprise a full-bridge rectifier in the form of four diodes connected in a Wheatstone bridge. Alternatively, the rectifier module may include a voltage doubler with active rectification to obtain higher efficiency. Active rectification may be provided using field effect transistors. It should be noted that other rectifier arrangement are also applicable.

As previously mentioned, the burst frequency is preferably lower than the excitation frequency. In fact the burst frequency may be variable within a predetermined frequency range. For example, such predetermined range may involve frequencies within the range 0-700 Hz, such as within the range 300-450 Hz, such as approximately 400 Hz. In special circumstances the burst frequency may be 0 Hz at full or at no (zero) load.

The excitation frequency may be selected within the range 200-500 kHz, such as within the range 300-400 kHz, such as within the range 50-75 kHz so that the equivalent load resistance, $R_{eq}$, is matched to the output impedance of the piezoelectric transformer so as to minimize power losses in the piezoelectric transformer.

It should be noted that the burst frequency and the excitation frequency is by no means limited to the above-mentioned frequency ranges. Thus, the burst frequency may reach several hundreds kHz whereas the excitation frequency may be in the MHz range. In order to keep losses at a reasonable low level the burst frequency should be kept as low as possible. On the other hand the burst frequency should be kept at a high level in order to reduce the physical dimensions of the capacitors in the system.

As previously mentioned, the piezoelectric transformer is preferably adapted for unconditionally zero-voltage-switching with respect to any load impedance. This may be complied with by ensuring that an equivalent output capacitance, $C_{d2}$, of the piezoelectric transformer is at least 13%, such as at least 15%, such as at least 20%, such as at least 30%, such as at least 35%, larger than an equivalent input capacitance, $C_{d1}$, times a conversion ratio, n, squared, i.e. $n^2$.

Moreover, the piezoelectric transformer may be adapted to transfer a main part of its energy in its thickness mode, and at the same time comply with the condition for unconditionally zero-voltage-switching with respect to any load impedance by making the volume of a secondary electrode at least 13%, such as at least 15%, such as at least 20%, such as at least 30%, such as at least 35%, larger than a volume of a primary electrode.

Alternatively, the piezoelectric transformer may be adapted to transfer a main part of its energy in its radial mode, and at the same time comply with the condition for unconditionally zero-voltage-switching with respect to any load impedance making the volume of a primary electrode at least 13%, such as at least 15%, such as at least 20%, such as at least 30%, such as at least 35%, larger than a volume of a secondary electrode.

Again, the specified volumes of the primary and secondary electrodes refer to the total volumes of the primary and second electrodes, respectively. Thus, the terms " . . . a volume of a primary electrode" refers to the total volume of those electrodes (for example a plurality of primary electrodes coupled in parallel) forming the primary electrode. Similarly, the terms " . . . a volume of a secondary electrode" refers to the total volume of those electrodes (for example a plurality of secondary electrodes coupled in parallel) forming the secondary electrode The piezoelectric transformer may be a ring-shaped piezoelectric transformer. However, other shapes may also be applicable. The output voltage, $V_{out}$, of the piezoelectric transformer may be within the range 5-40 V, and the equivalent load resistance, $R_{eq}$, may be within the range 3-40Ω. However, both the output voltage and the equivalent load resistance may be chosen differently.

Figure 14:
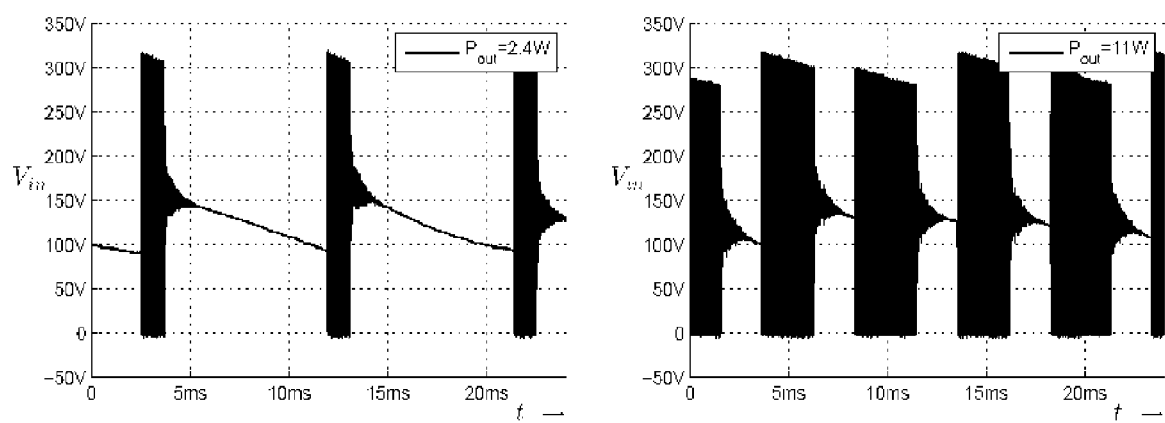
Figure 15:
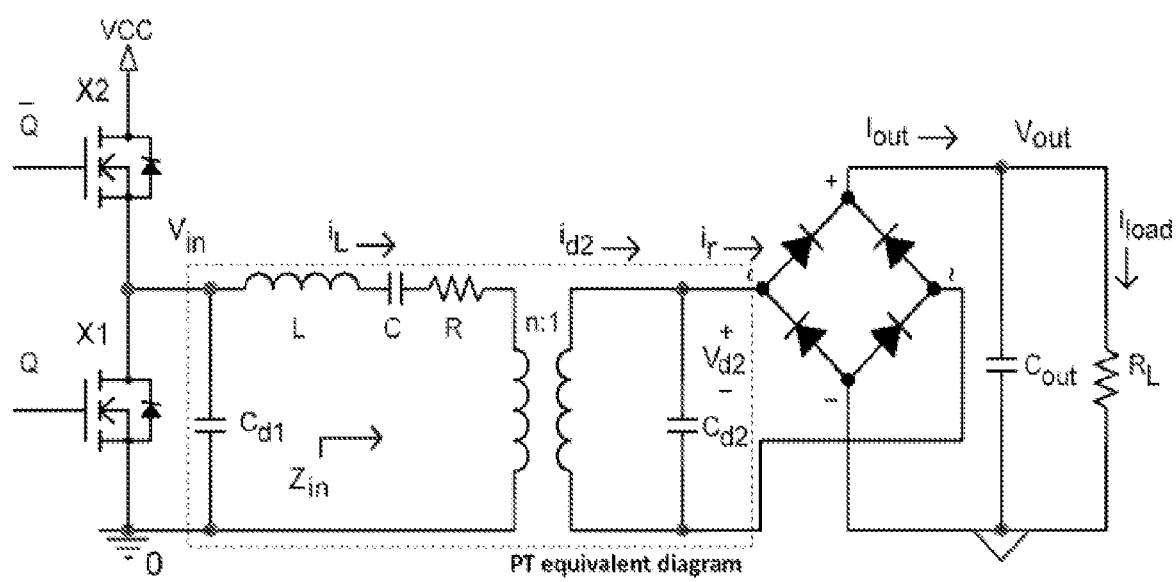
Figure 16:
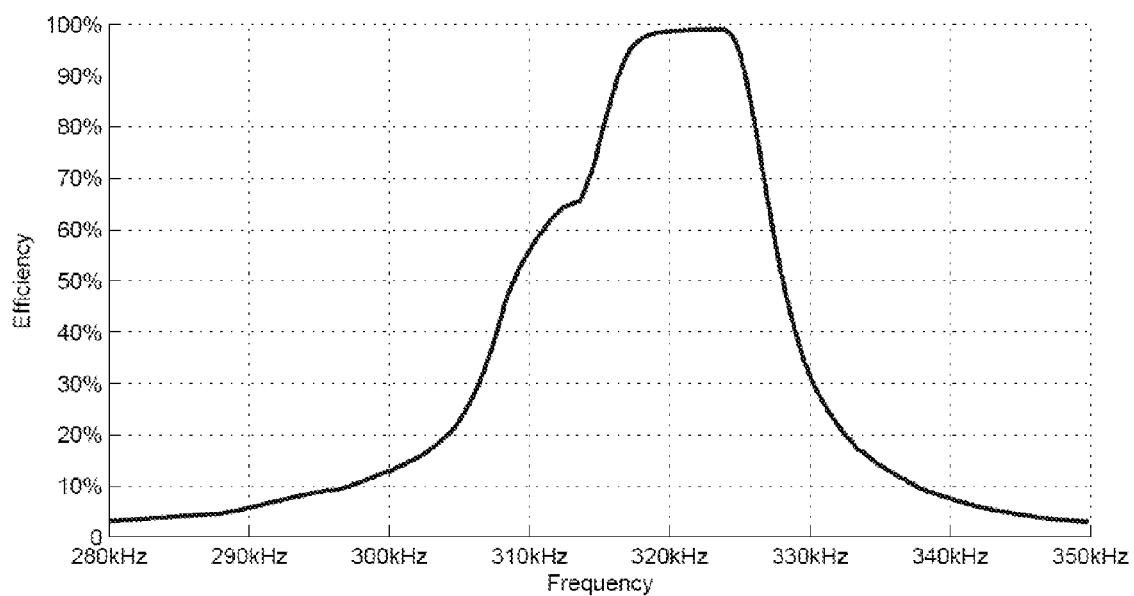
Figure 17:
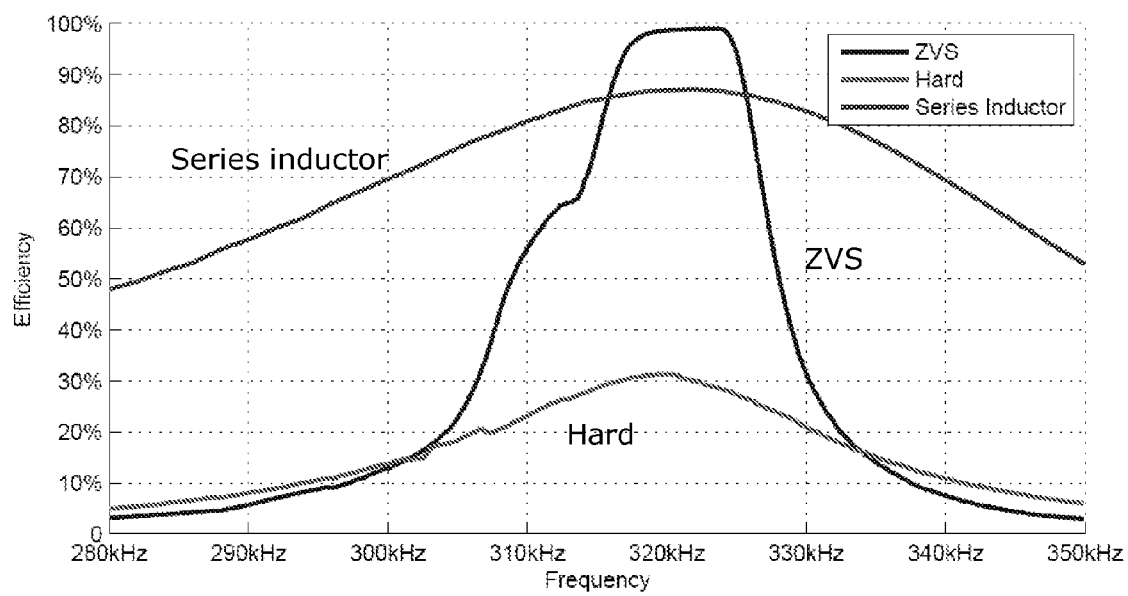
Figure 20:
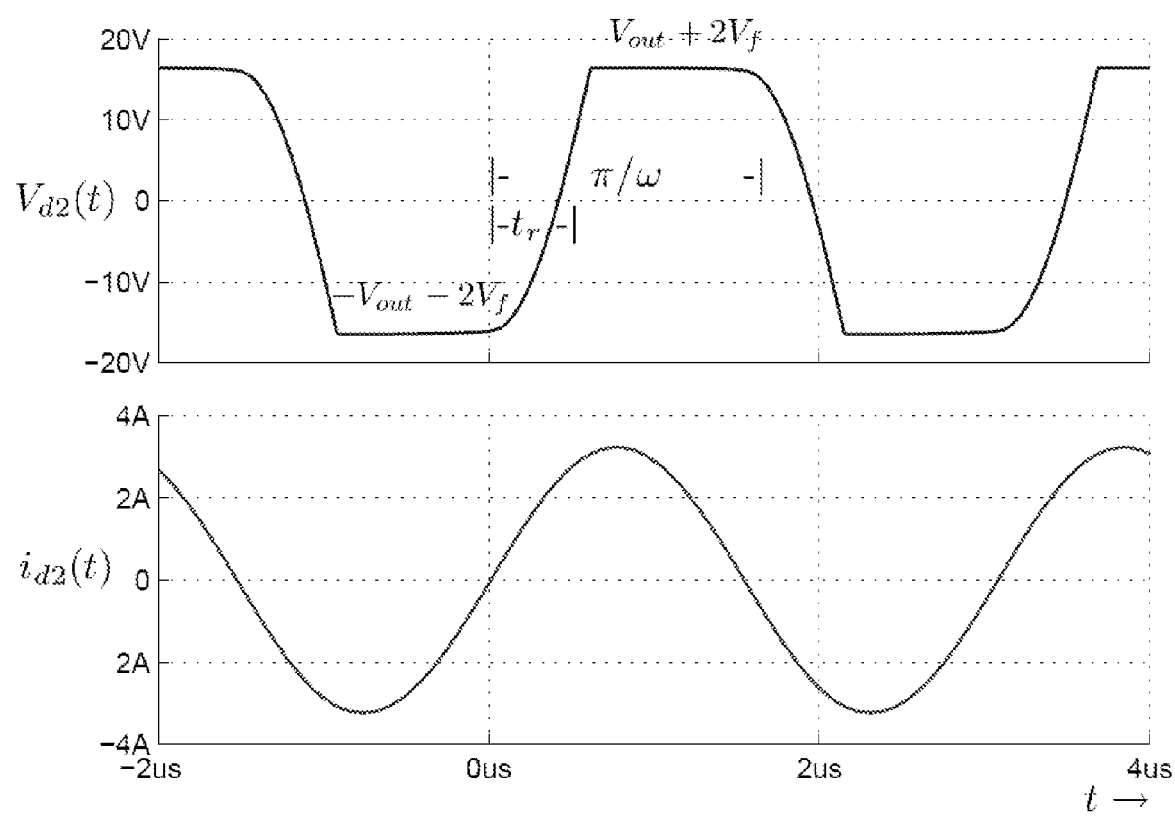
Figure 22:
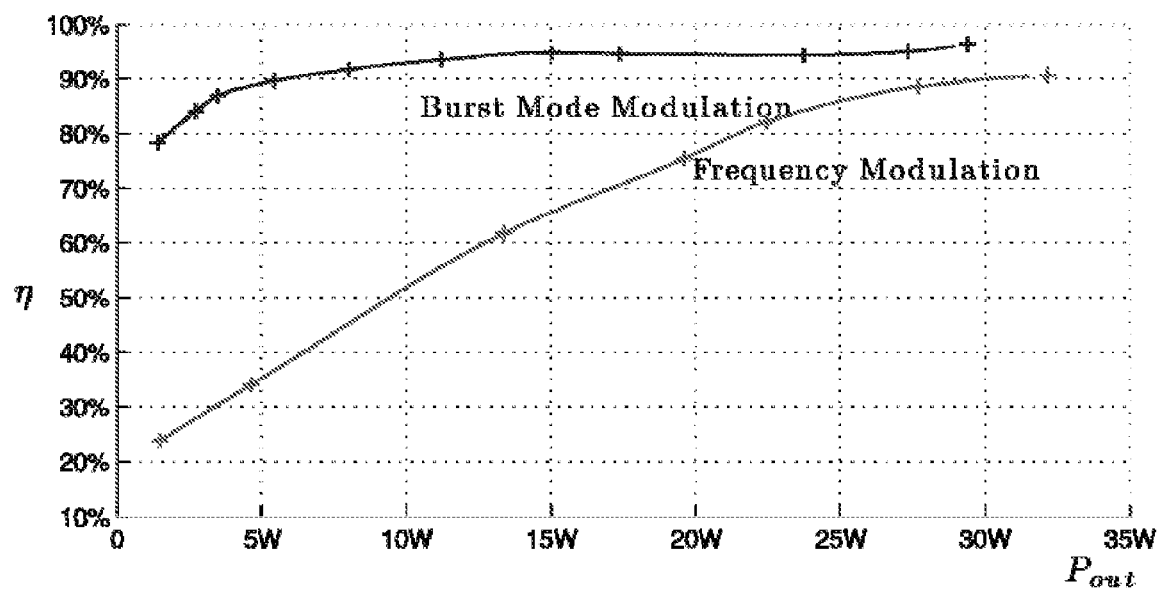
Figure 23:
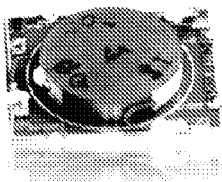
Figure 23:
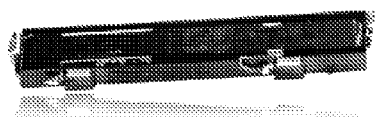
Figure 23:
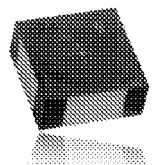
Figure 23:

The present invention and its advantages over prior art systems will now be explained in further details with reference to the accompanying drawings, wherein FIG. 1 shows an equivalent electrical circuit of a piezoelectric transformer, FIG. 2 shows a characteristic gain of piezoelectric transformer versus frequency and load resistance, FIG. 3 shows the open-loop efficiency and gain in relation to frequency for a piezoelectric transformer terminated with a matched load, FIG. 4 shows efficiency versus load resistance for three different piezoelectric transformers, FIG. 5 shows a Class E power stage connected to a piezoelectric transformer, FIG. 6 shows a half-bridge power stage connected to a piezoelectric transformer, FIG. 7 shows the switching wave-form of a half-bridge power stage operated in hard switching mode, FIG. 8 shows the efficiency of a half-bridge power stage in relation to frequency when operated in hard switching mode, FIG. 9 shows a half-bridge power stage connected to a piezoelectric transformer through a series inductor, FIG. 10 shows the switching wave-form of a half-bridge power stage operated in soft-switching mode, FIG. 11 shows the efficiency of a half-bridge power stage with a series inductor in relation to frequency, FIG. 12 shows the zero voltage switching ability for two different transformers in relation to frequency assuming a matched load, FIG. 13 illustrates the required variation in frequency in relation to the electrical load for a piezoelectric power converter employing frequency modulation as a means of providing a constant output voltage, FIG. 14 shows an input voltage to a piezoelectric transformer operated with burst mode modulation. In the left and right plots the output power is 2.4W and 11W, respectively, FIG. 15 shows an inductor-less half-bridge connected to a piezoelectric transformer with a full bridge rectifier connected, together with the denotation of the voltage $V_{d2}$ and current $I_{d2}$ at the output before $C_{d2}$ used to explain the property of matched load emulation using burst-mode modulation, FIG. 16 shows the efficiency in relation to frequency for an inductor-less power stage operated in zero-voltage-switching mode, FIG. 17 shows the efficiency of the half-bridge power stage in relation to frequency is compared between a configuration with inductor-less soft-switching (ZVS), soft-switching utilizing a series inductor (Series Inductor) and unconditionally hard-switching (Hard), FIG. 18 shows the closed-loop efficiency of a piezoelectric transformer using burst-mode modulation and a converter output voltage of 7V and an input voltage of 325V, FIG. 19 shows the closed-loop efficiency of a piezoelectric transformer using burst-mode modulation and a converter output voltage of 21 V and an input voltage of 325V, FIG. 20 shows voltage $V_{d2}$ and current $I_{d2}$ at the output before $C_{d2}$ of the piezoelectric transformer shown in FIG. 15 with a full bridge rectifier connected, FIG. 21 shows an equivalent load resistance solution space for a piezoelectric transformer assuming $2V_f=1.2V$. The matching resistance is 15Ω, FIG. 22 shows a characteristic efficiency curve for a complete power converter using frequency modulation and burst mode modulation respectively using a half-bridge power stage with a series inductor as in FIG. 9, and FIG. 23 displays 4 common types of piezoelectric transformers.

While the invention is susceptible to various modifications and alternative forms, specific embodiments have been shown by way of examples in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

In its broadest aspect the present invention relates to a method for applying burst mode modulation to control the output voltage of piezoelectric power converters, and to provide a method where a matched load resistance is emulated towards a piezoelectric transformer although the load is in fact varying. The power stage of the piezoelectric power converter is operated in soft-switching mode utilizing reactive energy from the piezoelectric transformer, and the output voltage is controlled at a constant level while maintaining an unconditional state of zero voltage switching.

The method according to the present invention involves exciting a piezoelectric transformer with a substantially constant excitation frequency, and operate a power stage in a low frequency alternating ON and OFF state, where the duty cycle controls the power delivered to the load. As previously mentioned this modulation type is named burst mode modulation and an example of the input voltage to a piezoelectric transformer is illustrated in FIG. 14. In the left plot of FIG. 14 the burst frequency is approximately 100 Hz whereas the burst frequency in the right plot is approximately 300 Hz. In both plots the excitation frequency is approximately 300 kHz.

The main advantage of burst mode modulation is that under certain operation conditions load matching can be emulated. This results in maximum efficiency although the load varies. Because the excitation frequency is kept constant it is also possible to operate the controllable power switches in a soft-switching mode with an inductor-less power stage by utilizing reactive energy stored in a special piezoelectric transformer designed for this type of operation.

The invention is based on the inductor-less half bride power stage shown in FIG. 15. As seen the half-bridge power stage comprises two power switches, X1 and X2, in a half-bridge configuration. The two switches excite a piezoelectric transformer while operated in soft-switching mode with a waveform as in FIG. 10. The output of the piezoelectric transformer is connected to a rectifier module that transfers a DC voltage to a variable load, $R_L$.

When reactive energy stored in a piezoelectric transformer is utilized as a means of achieving zero-voltage-switching the efficiency of the power stage can become very high. Because soft-switching without the aid of magnetic components can only be achieved under certain operating conditions and with a transformer adapted for this purpose, the circulating energy in the system only amount to what is required to establish a state of soft-switching, thus the conduction losses are at a minimum combined with almost zero switching losses.

FIG. 16 shows the efficiency of a half-bridge power stage in relation to the excitation frequency when operated in inductor-less zero-voltage-switching mode. In proximity of the resonance frequency soft-switching can not be achieved and the efficiency is between 5% and 25% as it was the case for the efficiency in FIG. 8 where the power stage was operated unconditionally in hard switching. With soft-switching however, the power stage efficiency in FIG. 16 rise to about 99% in a very limited frequency band above the resonance frequency which corresponds to the zero-voltage-switching window shown in FIG. 12 for the Face transformer.

In FIG. 17 the efficiency of the half-bridge power stage in relation to frequency is compared between a configuration with inductor-less soft-switching (label: ZVS), soft-switching utilizing a series inductor (label: Series inductor) and unconditionally hard-switching (label: Hard). Using the inductor-less soft-switching configuration the peak efficiency becomes 99% which is many times greater than the other two solutions with peak efficiencies at 88% and 32%, respectively. The low component count of this solution is also another positive factor to take into account. High efficiency combined with unconditionally inductor-less operation with respect the electrical load, can however only be obtained at a very limited excitation frequency and when the piezoelectric transformer has been adapted for this purpose.

Burst-mode modulation in itself satisfies one of the two conditions for inductor-less operation of the power stage, namely operation with a constant excitation frequency. This ensures that the power stage has an efficiency approaching 100%. In addition, the efficiency of the piezoelectric transformer is also a parameter to take into account. As illustrated in FIG. 4 and Eq. 1.2 the open-loop efficiency of the transformer peaks when the electrical load is matched to the absolute impedance of the output dielectric capacitance of the transformer. Typically a variable output power is linked to a variable load in which the transformer can not be operated efficiently across the whole range from zero to full output power. This is the case for power stages employing PWM and frequency modulation. With burst-mode modulation however, the piezoelectric is wrapped within a closed control loop that not only affects the output voltage of the converter but also controls the load seen from the piezoelectric transformer output towards the output rectifier (etc. in FIG. 15). In this way, using burst mode modulation, when excited at a proper frequency and with a piezoelectric transformer adapted for unconditionally zero-voltage-switching and adapted for burst-mode modulation the output rectifier emulates a constant load towards the piezoelectric transformer which maximizes the efficiency of the transformer.

Employing a burst-mode controller on the half-bridge power stage in FIG. 15, ensuring a constant excitation frequency while maintaining a constant output voltage across $C_{out}$, the emulation of a matched load and the controllability of the output power and the output voltage can be described as follows: When the power stage is turned ON and the piezoelectric transformer is being excited, a power of $P_{max}$ is transferred and shared between the electrical load and the capacitor $C_{out}$ placed after the output rectifier. When the power stage is turned OFF energy is delivered to the load from the output capacitor $C_{out}$. By alternating between an ON and OFF state the average output power becomes:

$$P_{load} = P_{max} \frac{t_{ON}}{t_{ON} + t_{OFF}} = P_{max} D$$

If more power is delivered then required by the load, the output voltage will start to rise. Similarly, if too little power is delivered, the output voltage will start to decrease. In this way the output voltage can be controlled and kept constant by adjusting the power flow. While neglecting the small ripple voltage across the output capacitor $C_{out}$ the output voltage $V_{out}$ across the load can now be assumed constant and independent of the size of the load. This is a very important property as it is used to explain how a matched load is emulated. The piezoelectric transformer is assumed connected to an output rectifier e.g. of the full-bridge type shown in FIG. 15. This rectifier effectively clamps the peak output voltage of the transformer $V_{d2}$ to the voltage across the output capacitor $V_{out}$ and it is this clamping voltage that determines the impedance seen by the piezoelectric transformer. Because there is no correlation between the output load $R_L$ placed at the output and the voltage across the output capacitor, given that the output voltage is effectively kept constant by burst-mode modulation, there will be no correlation between the output load $R_L$ and the load seen by the piezoelectric transformer. In this way any arbitrary impedance can be emulated towards the piezoelectric transformer. An example of the emulated impedance solution space towards the transformer of the type "Noliac 2005-09-05-A" is shown in FIG. 21.

The exact output impedance seen by the transformer is not longer a function of the load attached to the converter, but rather a complex function of the parameters for the specific transformer, the supply voltage $V_{CC}$ to the excitation stage (X1 and X2 in FIG. 15 etc.), the voltage at witch the output of the transformer is clamped at, together with a sensitivity to the excitation frequency. It is a requirement that the piezoelectric transformer is adapted to provide the right gain at the right excitation frequency to satisfy all the conditions to emulate a matched load towards the transformer while at the same time satisfy the conditions for zero-voltage-switching. When all conditions are met both the power stage and the piezoelectric transformer will be performing at maximum efficiency.

FIGS. 18 and 19 illustrate the closed-loop gain and transformer efficiency for a piezoelectric converter wrapped inside a burst-mode modulation control loop. The output voltages for the two figures are 7V and 14V respectively. Contrary to FIG. 3 where open-loop gain and efficiency for a piezoelectric transformer both peaked at the resonance frequency of the transformer, the gain is constant with burst-mode modulation and the efficiency has a valley point at resonance and should not be operated here. Depending on the gain using burst mode modulation, a matched load (i.e. maximum efficiency) can be obtained at one point above and one below the resonance frequency. As such the characteristic efficiency and gain plot is very different for a transformer operated in open-loop and closed-loop using burst mode modulation. Where the transformer has a peak efficiency of 98% at the resonance frequency in open-loop, this point of peak efficiency is mapped to a point both above and below resonance using burst-mode modulation and the exact location of these peaks is dependent on the gain (i.e. the ratio between the supply voltage $V_{CC}$ and the output voltage). This explains the difference between FIG. 18 and FIG. 19. Only the point above the resonance frequency can be used in combination with zero-voltage-switching. The piezoelectric transformer is designed such that the peak efficiency point above the resonance frequency is aligned within the frequency band at which zero-voltage-switching can be obtained (as illustrated in FIG. 12), i.e. where the efficiency of the power stage peaks (as illustrated FIG. 16).

Mathematically the emulation of a matched load using burst-mode modulation can be described as follows: Assuming that the output voltage is held constant by means of burst mode control the equivalent rectifier load resistance can be found for any type of rectifier configuration. If $F_o\{x(t)\}$ represents the fundamental component of Fourier transformation of the time varying signal x(t), then the equivalent resistance seen by the transformer in FIG. 15 is given by $$R_{eq} = \frac{F_o\{V_{d2}(t)\}}{F_o\{i_r(t)\}}$$

The signals $V_{d2}(t)$ and $i_r(t)$ are the output voltage and output current, respectively, of the piezoelectric transformer in FIG. 15 and $F_0\{V_{d2}(t)\}$ and $F_0\{i_r(t)\}$ are the fundamental Fourier components of these electrical quantities. The exact expression for the current and the voltage depends on the specific rectifier being used. The following derivation is based on the passive full-bridge rectifier shown in FIG. 15. If the amplitude and shape of $V_{d2}(t)$ is held constant by means of burst mode control, then the relative size of the equivalent load is determined by $i_r(t)$ which in turn is a function of frequency and the supply voltage, Vcc, to the power stage. As an example a large supply voltage, Vcc, will result in a small equivalent load.

The process of finding a mathematical expression for the equivalent output resistance of the burst mode power stage in FIG. 15 involves two steps. Firstly, the time interval $\Pi/\omega - t_r$ within which the output rectifiers are conducting needs to be found. Secondly, the current in that specific time interval needs to be averaged out in order to find $I_{out}$ which then can be related to the equivalent load resistance $R_{eq}$. The time interval, $\Pi/\omega - t$, together with the piezoelectric transformer output voltage and current waveforms ($V_{d2}(t)$ and $i_{d2}(t)$) are shown in FIG. 20.

The current in the LCR branch related to the secondary side $i_{d2}(t)$ is given by $$i_{d2}(t) = \text{Re}\left(-je^{j\omega t} \frac{V_{cc} A_f N}{|Z_{in}|}\right)$$

$$\text{where: } |Z_{in}| = \sqrt{\left(R + \frac{N^2}{2\omega C_{d2}}\right)^2 + (2L(\omega - \omega_r))^2}, \ A_f = \frac{4\sqrt{2}}{\pi^2}$$

The expression has sinusoidal shape as a base shape and the absolute value of $Z_{in}$ is used for the impedance since the phase shift is of no importance. The value $A_f \approx 0.57$ relates the trapezoidal rectifier waveform with amplitude $V_{out}+2V_f$ to the fundamental sinusoidal Fourier component seen by the piezoelectric transformer.

Whenever the current $i_{d2}(t)$ changes sign the output has to slew $2(V_{out}+2V_f)$ volts as shown in FIG. 20. This is done by charging $C_{d2}$ and this is expressed by the following integral:

$$2(V_{out} + 2V_f) = \frac{1}{C_{d2}}\int_0^{t_r} i_{d2}(t)\,dt' \Rightarrow$$

$$t_r = \frac{\mathrm{Re}(\cos^{-1}k)}{\omega}, \quad k = 1 - \frac{2(V_{out}+2V_f)\omega C_{d2}|Z_{in}|}{V_{CC}NA_f}$$

The solution to the charging time is given by $t_r$. When the expression k from the solution becomes larger than 1 the output voltage will be too large and the rectifiers will never conduct. In that case the cosine term in $t_r$ will represent a complex number with no real meaning. This is the reason why $\mathrm{Re}(\cos^{-1}k)$ is used in the solution for the charging time.

With an expression for the charging time the average output current $I_{out}$ can be found $$I_{out} = \frac{1}{\pi/\omega - t_r}\int_{t_r}^{\pi/\omega} i_{d2}(t)\,dt'$$
$$= \frac{V_{CC}A_f N(1+k)}{|Z_{in}|(\pi - \mathrm{Re}(\cos^{-1}k))}$$

Finally the equivalent load resistance can be found as $$R_{eq} = \frac{F_o\{V_{d2}(t)\}}{F_o\{I_r(t)\}}$$
$$= \frac{2(V_{out}+2V_f)}{\pi I_{out}}$$
$$= \frac{2(V_{out}+2V_f)|Z_{in}|(\pi - \mathrm{Re}(\cos^{-1}k))}{\pi V_{CC}A_f N(1+k)}$$

It is worth to notice that for a specific transformer the equivalent load resistance is solely a function of the ratio $V_{out}/V_{CC}$ (neglecting the rectifier forward voltage) and the frequency. In this way burst mode control can be used to emulate a constant and matched resistance although the real load is in fact varying. The curves plotted in FIG. 21 are examples of the equivalent load resistance solution space for a piezoelectric transformer controlled using burst mode modulation.

In FIG. 21 a matched load resistance of 15Ω has been marked. For some $V_{out}/V_{CC}$ rations load matching can be obtained by means tuning to the right frequency. For example, in case $V_{out}/V_{CC}=14V/325V$ such right frequency is around 283 kHz or around 354 kHz. Given the fact that the excitation frequency has to be larger than the resonance frequency of the piezoelectric transformer in order to achieve zero voltage switching 354 kHz is the optimal choice in this case. For a complete resonant power converter using a piezoelectric transformer, the characteristic efficiency curve for a complete power converter using frequency modulation and burst mode modulation respectively will become as illustrated in FIG. 22. It is evident that by using burst mode modulation the efficiency is constantly high although the load varies.

Using the equations for the equivalent load resistance solution space for burst-mode modulation a piezoelectric transformer can be designed such that the excitation frequency for which an emulated matched resistance coincide with the frequency of which optimal zero-voltage-switching can be achieved. This is solely a matter of adjusting the conversion ratio n in the equivalent circuit from FIG. 1. For a piezoelectric transformer transferring the main parts of its energy in a radial mode using the electromechanical coupling $k_{31}$, the equivalent gain according to the notation in FIG. 1 is given by n=N2/N1, wherein N1 is the number of primary layers and N2 is the number of secondary layers. Moreever the piezoelectric transformer can also be of the type where the main part of the its energy is transferred in a thickness mode using the electromechanical coupling $k_{33}$, wherein the equivalent gain according to the notation in FIG. 1 is given by $n=e_p/e_s$, in which $e_p$ is the thickness of each primary layer and $e_s$ is the thickness of each secondary layer. Other types of piezoelectric transformers can also be operated a maximum efficiency given the conversion ration n and the excitation frequency is chosen according to the derived equations.

Almost every piezoelectric transformer can achieve inductor-less zero-voltage-switching although it might require a termination with an unmatched load which provides less damping but also compromises on efficiency in order to achieve a state of soft-switching. For high efficiency the transformer should be terminated with a matched load, because this is the point at which the maximum amount of energy is extracted from the piezoelectric transformer. This does however also mean that a matched load is the condition that enforces the largest possible amount damping to the transformer, in which a matched load becomes a worst-case scenario in terms of zero-voltage-switching ability. If the ZVS factor $V_P$ in the equation below is above 100%, zero-voltage-switching can be achieved even with a matched load and as such the equation provides a measure for unconditionally zero-voltage-switching ability with respect to the electrical load seen by the output of the piezoelectric transformer.

$$V_P = \frac{1}{n^2}\frac{C_{d2}}{C_{d1}}\frac{32\sqrt{6}}{9\pi^2}\eta$$

where n is the conversion ratio following the notation in FIG. 1, $C_{d1}$ and $C_{d2}$ is the equivalent input and equivalent output capacitance respectively and $\eta$ is the efficiency of the transformer. In practice $C_{d1}$ in the equation should be replaced by the parallel capacitance of $C_{d1}$ and the effective parasitic output capacitance of the controllable switches in the power stage.

Assuming an efficiency approaching 100% and a parasitic capacitance of the power stage approaching zero, any piezoelectric transformer can be adapted for unconditionally zero-voltage-switching with respect to any load impedance, given that the equivalent output capacitance "$C_{d2}$" of the piezoelectric transformer is at least 13% and more reasonable 35% larger than the equivalent input capacitance "$C_{d1}$" times conversion ratio "n" square. This corresponds to a ZVS factor of $V_P=100\%$ and $V_P=120\%$, respectively. By taking the effective parasitic output capacitance of the power stage into account, the ZVS factor will be decreased and that is why a reference ZVS factor 120% is more reasonable for a balanced design.

A common property for different types of piezoelectric transformers is that the mechanical dimensions cannot be optimized for both high efficiency and a high ZVS factor. A design optimized solely for efficiency will typically have a ZVS factor between 10-45% using a matched load (which is a worst-case scenario in terms of damping) and it requires a power stage with one or more series or parallel inductors in order to avoid hard switching. By increasing the ZVS factor in such a design to 120% would typically increase the loss in the transformer by 50%, but when the efficiency of the power stage and the optional series or parallel inductors is taken into account, the efficiency of the complete converter will be many times greater using a transformer optimized for unconditionally zero-voltage-switching.

For a piezoelectric transformer where the main part of its energy in transferred in its thickness mode using the electromechanical coupling $k_{33}$, the ZVS condition corresponds to a total volume of the secondary electrode(s) that is at least 13% and more reasonable 35% larger than the total primary electrode volume i.e. a ZVS factor of $V_P=100\%$ and $V_P=120\%$, respectively. This is the case for a ring shaped transformer of the type shown in FIG. 23. A disc or a square shaped as the ones shown in FIG. 23 can also be operated effectively in a thickness mode if the ratio $k_{33}/k_{31}$ approaches infinity, i.e. if the material has strong anisotropic properties.

For a transformer operated in a radial or planar mode, the main part of the energy is transferred using the electromechanical coupling factor $k_{31}$. In this case the unconditional zero-voltage-switching condition is met if the total volume of the primary electrode is at least 13% and more reasonable 35% larger than the total secondary electrode volume. This is just the opposite case than for a transformer operated in it's thickness mode. The disc and the square type transformer shown in FIG. 23 both operate most efficiently by transferring the energy at a resonance frequency the utilizes the $k_{31}$ coefficient, given a material with isotropic properties.

In general any type of piezoelectric transformer can be adjusted for unconditionally zero-voltage-switching ability if a relation between the mechanical layout and the equivalent parameters n, $C_{d1}$ and $C_{d2}$ according to the notation in FIG. 1. can be found and wherein $C_{d2}$ is at least 13% and more reasonable 35% larger than $C_{d1}$ times conversion ratio n square.

The invention claimed is:

1. An electronic power converter comprising
a piezoelectric transformer comprising an input and an output port,
a drive circuit arranged to generate and provide, from a supply voltage $V_{cc}$, an input voltage signal to the input port of the piezoelectric transformer, said input voltage signal comprising a burst frequency and a substantially constant excitation frequency, and
a rectifier module comprising an input port operatively coupled to the output port of the piezoelectric transformer, the rectifier module further comprising an output port adapted to deliver an output voltage, $V_{out}$, to a load,
wherein the excitation frequency is higher than a fundamental resonance frequency of the piezoelectric transformer, and wherein the excitation frequency is selected among a plurality of excitation frequencies in such a way that an equivalent load resistance, $R_{eq}$, under closed-loop burst-mode operation is matched to an output impedance of the piezoelectric transformer so as to minimize power losses in the piezoelectric transformer, and wherein the selected excitation frequency falls within an optimal excitation frequency range regarding zero-voltage-switching abilities of the piezoelectric transformer.

2. An electronic power converter according to claim 1, wherein the burst frequency is lower than the excitation frequency.

3. An electronic power converter according to claim 1, wherein the burst frequency is variable within a predetermined frequency range.

4. An electronic power converter according to claim 1, further comprising one or more controllable excitation switches being connected directly to the input port of the piezoelectric transformer.

5. An electronic power converter according to claim 1, where the piezoelectric transformer is adapted for unconditionally zero-voltage-switching with respect to any load impedance, and wherein an equivalent output capacitance, $C_{d2}$, of the piezoelectric transformer is at least 13% larger than an equivalent input capacitance, $C_{d1}$, times a conversion ratio, n, square.

6. An electronic power converter according to claim 1, wherein the piezoelectric transformer is adapted to transfer a main part of its energy in its thickness mode, and wherein the condition for unconditionally zero-voltage-switching with respect to any load impedance is met by making a volume of a secondary electrode at least 13% larger than a volume of a primary electrode.

7. An electronic power converter according to claim 1, wherein the piezoelectric transformer is adapted to transfer a main part of its energy in its radial mode, and wherein the condition for unconditionally zero-voltage-switching with respect to any load impedance is met by making a volume of a primary electrode at least 13% larger than a volume of a secondary electrode.

8. An electronic power converter according to claim 1, wherein the drive circuit comprises a half-bridge power stage comprising first and second controllable excitation switches.

9. An electronic power converter according to claim 1, wherein the drive circuit comprises a full-bridge power stage comprising first, second, third and fourth controllable excitation switches.

10. An electronic power converter according to claim 8, wherein each of the controllable excitation switches comprises a field effect transistor.

11. An electronic power converter according to claim 1, wherein the piezoelectric transformer is a ring-shaped piezoelectric transformer.

12. A method for configuring an electronic power converter, the method comprising
providing a piezoelectric transformer comprising an input and an output port,
providing a drive circuit arranged to generate and provide, from a supply voltage $V_{cc}$, an input voltage signal to the input port of the piezoelectric transformer, said input voltage signal comprising a burst frequency and a substantially constant excitation frequency,
providing a rectifier module comprising an input port adapted to be operatively coupled to the output port of the piezoelectric transformer, the rectifier module further comprising an output port adapted to deliver an output voltage, $V_{out}$, to a load, and
selecting the excitation frequency among a plurality of excitation frequencies in such a way that an equivalent load resistance, $R_{eq}$, under closed-loop burst-mode operation is matched to an output impedance of the piezoelectric transformer so as to minimize power losses in the piezoelectric transformer, and wherein the selected excitation frequency falls within an optimal excitation frequency range regarding zero-voltage-switching abilities of the piezoelectric transformer.

13. A method according to claim 12, wherein the burst frequency is lower than the excitation frequency.

14. A method according to claim 12, wherein the burst frequency is variable within a predetermined frequency range.

15. A method according to claim 12, wherein one or more controllable excitation switches are connected directly to the input port of the piezoelectric transformer.

16. A method according to claim 12, where the piezoelectric transformer is operated for unconditionally zero-voltage-switching with respect to any load impedance, and wherein an equivalent output capacitance, $C_{d2}$, of the piezoelectric transformer is at least 13% larger than an equivalent input capacitance, $C_{d1}$, times a conversion ratio, n, square.

17. A method according to claim 12, wherein the piezoelectric transformer is operated so as to transfer a main part of its energy in its thickness mode, and wherein the condition for unconditionally zero-voltage-switching with respect to any load impedance is met by making a volume of a secondary electrode at least 13% larger than a volume of a primary electrode.

18. A method according to claim 12, wherein the piezoelectric transformer is operated so as to transfer a main part of its energy in its radial mode, and wherein the condition for unconditionally zero-voltage-switching with respect to any load impedance is met by making a volume of a primary electrode at least 13% larger than a volume of a secondary electrode.

19. A method according to claim 12, wherein the excitation frequency is higher than a fundamental resonance frequency of the piezoelectric transducer.

20. A method according to claim 12, wherein the drive circuit provides the input voltage signal directly to the input port of the piezoelectric transformer.

21. A method according to claim 12, wherein the drive circuit comprises a half-bridge power stage comprising first and second controllable excitation switches.

22. A method according to claim 12, wherein the drive circuit comprises a full-bridge power stage comprising first, second, third and fourth controllable excitation switches.

23. A method according to claim 21, wherein each of the controllable excitation switches comprises a field effect transistor.

24. A method according to claim 12, wherein the piezoelectric transformer is a ring-shaped piezoelectric transformer.

* * * * *